(12) United States Patent
Miller et al.

(10) Patent No.: US 7,736,473 B2
(45) Date of Patent: *Jun. 15, 2010

(54) MAGNETRON HAVING CONTINUOUSLY VARIABLE RADIAL POSITION

(75) Inventors: Keith A. Miller, Sunnyvale, CA (US); Anantha K. Subramani, San Jose, CA (US); Maurice E. Ewert, San Jose, CA (US); Tza-Jing Gung, San Jose, CA (US); Hong S. Yang, Pleasanton, CA (US); Vincent E. Burkhart, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1162 days.

This patent is subject to a terminal disclaimer.

(21) Appl. No.: 11/226,858

(22) Filed: Sep. 14, 2005

(65) Prior Publication Data

US 2006/0076232 A1 Apr. 13, 2006

Related U.S. Application Data

(63) Continuation-in-part of application No. 10/949,735, filed on Sep. 23, 2004, now Pat. No. 7,018,515.

(60) Provisional application No. 60/555,992, filed on Mar. 24, 2004.

(51) Int. Cl.
*C23C 14/35* (2006.01)
(52) U.S. Cl. .............. 204/192.12; 204/192.17; 204/298.2
(58) Field of Classification Search ............ 204/192.12, 204/192.17, 298.2
See application file for complete search history.

(56) References Cited

U.S. PATENT DOCUMENTS

| 4,714,536 | A |   | 12/1987 | Freeman et al. ............. 204/298 |
| 4,902,931 | A | * | 2/1990 | Veltrop et al. ............... 315/326 |
| 5,171,415 | A |   | 12/1992 | Miller et al. ............. 204/298.2 |
| 5,188,717 | A |   | 2/1993 | Broadbent et al. ..... 204/192.12 |
| 5,879,519 | A |   | 3/1999 | Seeser et al. |
| 5,944,968 | A |   | 8/1999 | Kobayashi ............... 204/298.2 |
| 6,013,159 | A |   | 1/2000 | Adams et al. .......... 204/192.12 |
| 6,228,236 | B1 |  | 5/2001 | Rosenstein et al. ....... 204/298.2 |

(Continued)

FOREIGN PATENT DOCUMENTS

EP 1067577 7/2000

(Continued)

OTHER PUBLICATIONS

Translation of Fu et al. JP 11-074225 dated Mar. 1999.*

*Primary Examiner*—Rodney G McDonald
(74) *Attorney, Agent, or Firm*—Law Office of Charles Guenzer

(57) ABSTRACT

A continuously variable multi-position magnetron that is rotated about a central axis in back of a sputtering target at a freely selected radius. The position is dynamically controlled from the outside, for example, through a hydraulic actuator connected between a pivoting arm supporting the magnetron and an arm fixed to the shaft, by two coaxial shafts independent controllable from the outside and supporting the magnetron through a frog-leg mechanism, or a cable connected between the pivoting arms and moved by an external slider. The magnetron can be rotated at two, three, or more discrete radii or be moved in a continuous spiral pattern.

8 Claims, 15 Drawing Sheets

U.S. PATENT DOCUMENTS

| | | | |
|---|---|---|---|
| 6,254,747 B1 | 7/2001 | Hoshino et al. | |
| 6,306,265 B1 | 10/2001 | Fu et al. | 204/192.12 |
| 6,692,617 B1 | 2/2004 | Fu et al. | 204/192.12 |
| 6,841,050 B2 | 1/2005 | Hong et al. | 204/298.2 |
| 6,852,202 B2 | 2/2005 | Miller et al. | 204/192.13 |
| 7,018,515 B2 * | 3/2006 | Gung et al. | 204/192.12 |
| 2005/0236403 A1 | 10/2005 | Kingman | |
| 2005/0274610 A1 | 12/2005 | Iseki | |

FOREIGN PATENT DOCUMENTS

| | | | |
|---|---|---|---|
| JP | 7-226398 | | 8/1995 |
| JP | 11-074225 | * | 3/1999 |

* cited by examiner

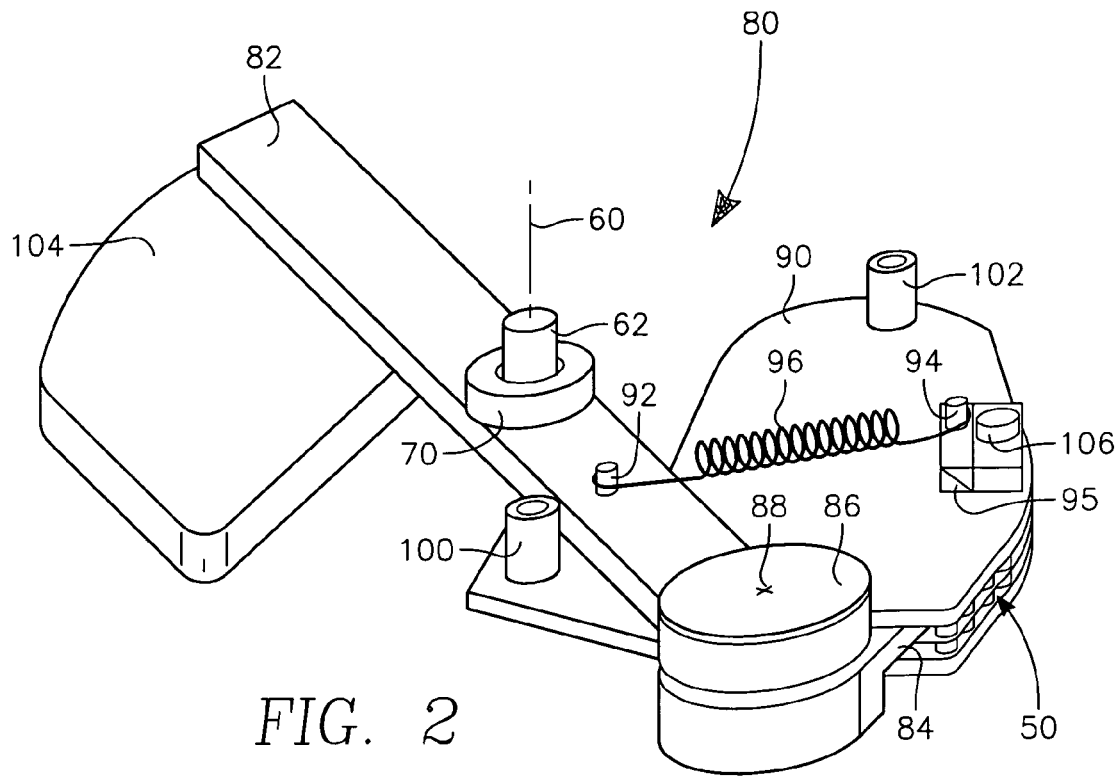
FIG. 2
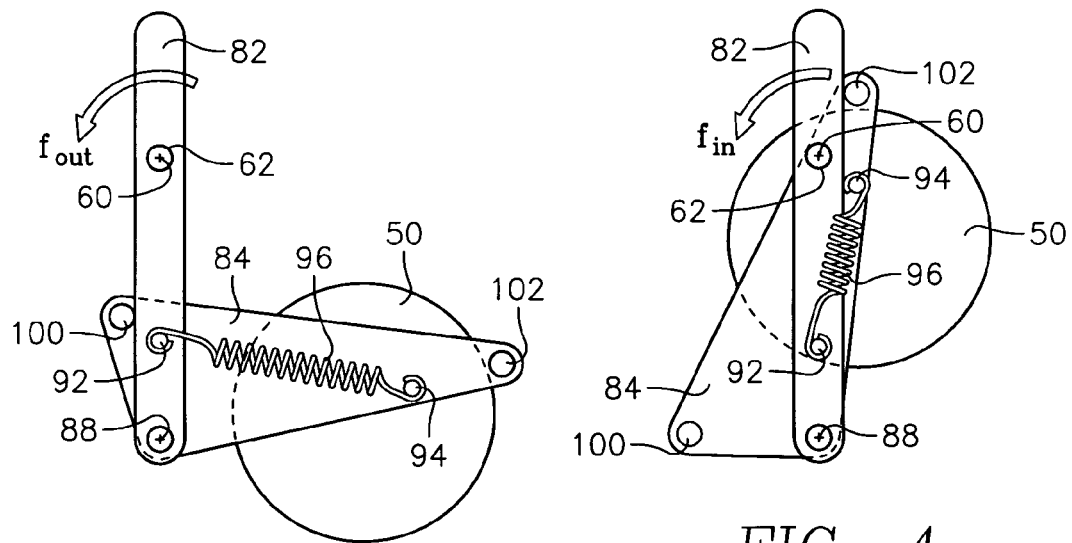
FIG. 3
FIG. 4

MAGNETRON HAVING CONTINUOUSLY VARIABLE RADIAL POSITION

RELATED APPLICATION

This application is a continuation in part of Ser. No. 10/949,735, filed Sep. 23, 2004, now issued as U.S. Pat. No. 7,018,515, which claims benefit of provisional application 60/555,992, filed Mar. 24, 2004.

FIELD OF THE INVENTION

The invention relates generally to sputtering of materials. In particular, the invention relates to variable positioning of the magnetron creating a magnetic field to enhance sputtering.

BACKGROUND ART

Sputtering, alternatively called physical vapor deposition (PVD), is the most prevalent method of depositing layers of metals and related materials in the fabrication of integrated circuits. Sputtering was originally used to deposit generally planar layers of material on a wafer and has particularly been used for depositing aluminum electrical interconnect lines. However, in recent years, the emphasis and challenges have shifted to depositing materials used in vertical interconnections in high aspect-ratio vias and similar vertically oriented structures formed in and through dielectric layers. Copper metallization has further changed the emphasis since bulk copper can be easily deposited by electrochemical plating (ECP). However, various thin liner layers are required prior to the ECP, for example, a barrier layer, such as Ta and TaN, to prevent the copper from migrating into the oxide dielectric or thin copper seed layer to act as a plate electrode and to initiate the growth of the copper ECP layer.

Techniques have been developed to allow the sputter deposition of thin uniform layers onto the walls of high aspect-ratio holes. One such technique that has met significant commercial success is self-ionizing plasma (SIP) sputtering in which a significant fraction of the sputtered atoms are ionized and thus can be electrostatically attracted deep within narrow holes. It is called self-ionizing plasma because some of the sputtered ions are attracted back to the sputtering target to sputter yet more atoms or ions, thereby reducing the need for an argon working gas and allowing sputtering at a lower pressure. The extreme of SIP is sustained self-sputtering (SSS) in which the sputtered ions are sufficient to maintain the sputtering plasma and hence the argon can be removed after plasma ignition.

A conventional PVD chamber 10, with a few modifications for SSS or SIP sputtering, is illustrated schematically in cross section in FIG. 1. The illustration is based upon the Endura PVD Reactor available from Applied Materials, Inc. of Santa Clara, Calif. The chamber 10 includes a vacuum chamber body 12 sealed through a ceramic insulator 14 to a sputtering target 16 having at least a front face composed of the material, usually a metal, to be sputter deposited on a wafer 18 held on a heater pedestal electrode 20 by a wafer clamp 22. Alternatively to the wafer clamp 22, a cover ring or an electrostatic chuck may be incorporated into the pedestal 20 or the wafer may be placed on the pedestal 20 without being held in place. The target material may be aluminum, copper, aluminum, titanium, tantalum, cobalt, nickel, molybdenum, alloys of these metals containing less than 10 wt % of an alloying element, or other metals and metal alloys amenable to DC sputtering. On the other hand, RF sputtering may be used to sputter material from a dielectric target.

A grounded shield 24 held within the chamber body 12 protects the chamber wall 12 from the sputtered material and provides a grounded anode. An additional floating shield may be used. A selectable and controllable DC power supply 26 negatively biases the target 14 to about −600 VDC with respect to the shield 24. Conventionally, the pedestal 20 and hence the wafer 18 are left electrically floating, but for most types of SIP sputtering, an RF power supply 28 is coupled to the pedestal 18 through an AC capacitive coupling circuit 30 or more complex matching and isolation circuitry to allow the pedestal electrode 20 to develop a DC self-bias voltage in the presence of a plasma. A negative DC self-bias attracts positively charged sputter ions created in a high-density plasma deeply into a high aspect-ratio holes characteristic of advanced integrated circuits. Even when the pedestal 20 is left electrically floating, it develops some DC self-bias.

A first gas source 34 supplies a sputtering working gas, typically argon, to the chamber body 12 through a mass flow controller 36. In reactive metallic nitride sputtering, for example, of titanium nitride or tantalum nitride, nitrogen is additionally supplied into the chamber from another gas source 38 through its own mass flow controller 40. Oxygen can alternatively be supplied to produce oxides such as $Al_2O_3$. The gases can be admitted from various positions within the chamber body 12. For example, one or more inlet pipes located near the bottom of the chamber body 12 supply gas at the back of the shield 24. The gas penetrates through an aperture at the bottom of the shield 24 or through a gap 42 formed between the cover ring 22 and the shield 24 and the pedestal 20. A vacuum pumping system 44 connected to the chamber body 12 through a wide pumping port 46 maintains the interior of the chamber body 12 at a low pressure. Although the base pressure can be held to about $10^{-7}$ Torr or even lower, the conventional pressure of the argon working gas is typically maintained at between about 1 and 100 milliTorr. However, for self-ionized sputtering, the pressure may be somewhat lower, for example, down to 0.1 mTorr. For sustained self-sputtering, particularly of copper, once the plasma has been ignited, the supply of argon may be stopped, and the chamber pressure may be made very low. A computer-based controller 48 controls the reactor including the power supplies 26, 28 and the mass flow controllers 36, 40.

When the argon is admitted into the chamber, the DC voltage between the target 16 and the shield 24 ignites the argon into a plasma, and the positively charged argon ions are attracted to the negatively biased target 16. Similarly, in SIP sputtering, positively charged metal ions sputtered from the target 16 are attracted back to it. The ions strike the target 16 with a substantial energy and cause target particles to be sputtered from the target 16. Some of the target particles strike the wafer 18 and are thereby deposited on it, thereby forming a film of the target material.

To provide efficient sputtering, a magnetron 50 is positioned in back of the target 16. It includes opposed magnets 52, 54 coupled by a magnetic yoke 56 to produce a magnetic field within the chamber in the neighborhood of the magnets 52, 54. Typically in SIP sputtering, the magnetron 50 is small, nested, and unbalanced with one or more inner magnets 52 surrounded by opposed outer magnets 54 of greater magnetic intensity. The magnetic field traps electrons and, for charge neutrality, the ion density also increases to form a high-density plasma region 58 within the chamber adjacent to the magnetron 50. To achieve uniform sputtering onto the wafer 18, the magnetron 50 is usually rotated about the center 60 of the target 16 by a shaft 62 driven by a motor 64. Typical rotation speeds are 50 to 100 rpm. In a conventional magnetron, the shaft 62 is fixed with respect to the magnets 52, 54 and is coincident with the target center 60 so that the magnetron 50 sweeps a constant track about the target center 60.

Fu in U.S. Pat. No. 6,306,265 discloses several designs of a magnetron useful for SSS and SIP. For these applications, the magnetron should produce a strong magnetic field and have a small area. Rotating the magnetron can nonetheless provide uniform sputter deposition and full target erosion if desired. The magnetron should include an inner pole associated with one or more inner magnets 52 surrounded by a continuous outer pole of the opposite polarity associated with the outer magnets 54. The inner and outer poles are unbalanced in the sense that the total magnetic flux produced by the outer pole is substantially greater than that produced by the inner pole by a factor of at least 1.5. Thereby, magnetic field lines from the outer pole 54 extend deeply into the chamber towards the wafer 16. The power supplied by the DC supply 26 to the target 16 should be high, of the order of 20 kW for a 200 mm wafer. However, scaling the power supply for 300 mm wafers presents some difficulties. Nonetheless, the combination of high power and small magnetron area produces a very high power density beneath the magnetron 50 and hence a moderately high-density plasma area 58 without the use of supplemental plasma source power, such as would be provided by RF inductive coils. The form and size of the magnetron 50 are related to some aspects of the invention.

Auxiliary magnets may be placed on the chamber sidewalls to focus the plasma and prevent its diffusion to the sidewalls.

To counteract the large amount of power delivered to the target, the back of the target 16 may be sealed to a backside coolant chamber 66. Chilled deionized water 68 or other cooling liquid is circulated through the interior of the coolant chamber 66 to cool the target 16. The magnetron 50 is typically immersed in the cooling water 68, and the target rotation shaft 62 passes through the back chamber 66 through a rotary seal 70.

Such an SIP chamber 10 can be used for both sputtering the barrier layer, for example, of TaN/Ta from a tantalum target and sputtering the thin copper seed layer from a copper target. Particularly for barrier layers, continuous and symmetrical deposition with the structure is critical for minimum sidewall coverage requirement and via bottom thin-down/punch-through process. Barrier sputtering has been found to be optimized for relatively small magnetrons that concentrate on the peripheral region or edge of the target with little or no effective sputtering in the target center. Material eroded from the target periphery region strikes the wafer at preferred incident angles to achieve symmetrical step coverage. In addition, the small magnetron produces a high power density and hence high ionization fraction with a relatively low DC power supply. Uniform target erosion and high average sputtering rate in the case of Cu and Al deposition are not primary considerations for the small amount of material being sputtered for the thin barrier or seed on each wafer. However, target erosion at the periphery of the target will produce re-deposition around the central area of the target, which central area is not on net eroded. The redeposited material does not bond well with the target and tends to flake off as it accumulates beyond a critical thickness. Measures are needed to prevent the flaking, which produces a high level of particles and greatly reduce the integrated circuit yield.

For SIP sputtering with magnetrons not extending over an entire radius of the target 16, the rotating magnetron 50 does not scan the entire area of the target 16 and sputtered material tends to redeposit on the non-scanned areas. Copper redeposition does occur but is not generally considered to be a significant problem since the redeposited copper bonds relatively well with the copper target. Barrier redeposition, however, may present a significant problem. Part of the barrier sputtering may occur in a nitrogen ambient in a process called reactive sputtering to deposit a metal nitride layer, such as TaN or TiN, on the wafer to form a Ta/TaN or Ti/TiN bilayer barrier.

Rosenstein et al. (hereafter Rosenstein) in U.S. Pat. No. 6,228,236 have presented a solution for the redeposited material. They affix their magnetron 50 to an eccentric arm such that centrifugal force can be controlled to cause the magnetron to assume two radial positions depending upon the rotational direction of the magnetron drive shaft 62. Rosenstein effectively interposes a radial translation mechanism 74 between the rotation drive shaft 62 and the magnetron 50. They are primarily concerned with redeposition on the target periphery outside the operational area of the target when a relatively large but weak magnetron is being used. Their design provides a small radial translation of the magnetron and the orientation of their magnetron to the rotation circumference remains substantially unchanged between the two positions. Also, the switching depends at least in part on hydrodynamics. We believe that the Rosenstein design could be modified to enable cleaning the target center, but this would rely on a reversal of the magnetron rotation. It is instead desired to provide a magnetron design which avoids the need to reverse the direction of rotating the magnetron, thereby quickening the transition between multiple radial rotation diameters. Such a design would desirably minimize the time necessary for achieving a clean mode position so as to maximize the fraction of time for wafer deposition, in order to obtain high throughput.

Various types of planetary magnetrons have been proposed, see for example U.S. patent application Ser. No. 10/152,494, filed May 21, 2002 by Hong et al. and now issued as U.S. Pat. No. 6,841,050, and U.S. patent application Ser. No. 10/418,710, filed Apr. 17, 2003 by Miller et al. and now issued as U.S. Pat. No. 6,852,202, both of which are commonly assigned with the present application. The disclosed planetary mechanisms are capable of scanning a small magnetron over substantially all of the target surface in a planetary path produced by two rotational arms. Ito in Japanese Laid-Open Patent Application (Kokai) 7[1995]-226398 discloses a coupled azimuthal and radial movement of the magnetron. Although planetary or coupled azimuthal scanning in a single though convolute path can be used to avoid more uniform erode the target and avoid redeposition, it is nonetheless often desired to confine the primary sputtering to a relatively narrow radial range of the target. That is, it is desired to perform azimuthal scanning at selected radii.

SUMMARY OF THE INVENTION

In one aspect of the invention, a two-step sputter process includes one or more steps of sputter depositing a barrier metal on a substrate while scanning the outer edge of a target with a small magnetron moving in an outer circular path and another step of cleaning the target by moving the magnetron towards the center of the target and scanning at least the center of the target with the magnetron moving in an inner circular path. The cleaning may be performed for every substrate being deposited or may be performed after every few substrates or every few hundreds of kilowatt hours of target power.

A mechanism moves the effective center of the magnetron with respect to the target radius and allows a rotary shaft to rotate the magnetron about the target center while at different target radii.

One unidirectional, multi-speed centrifugal mechanism for a dual-position magnetron supports the magnetron on a pivot arm pivoting on a bracket which rotated about the central axis of a sputter target by a mechanical drive shaft. A spring or other bias means biases the magnetron in one radial direction with respect to the central axis. Centrifugal force dependent upon the rotation rate of the drive shaft can be set high enough to overcome the bias force. Thereby, selection of the rotation rate causes the magnetron to rotate at different radii from the central axis. Preferably, a tension spring connected between the bracket and the pivot plate biases the magnetron towards central axis while centrifugal force on the magnetron urges it outwardly.

Mechanical stops may be used to prevent over pivoting in either direction, thereby providing definite control over the rotation radius. The stops should be shock absorbent, such as resilient buffers or shock absorbers.

The pivot mechanism between the bracket and pivot arm may include two water-sealed bearings including at least one dynamic seal to allow the dual-position magnetron to operate in a cooling water bath at the back of the target.

A centrifugal dual position mechanism can alternatively be implemented in a linear slider in which a radially extending slot is formed in the rotating bracket. A support for the magnetron is fit in the slot and can slide radially therein. One or more springs may be used to bias the magnetron towards the rotary center while centrifugal force urges the magnetron away from the center. Engagement of the support with the either end of the slot provides a positive mechanical stop.

A pivoting motion of the magnetron, whether through centrifugal force or with an actuator, is advantageously applied to an elongated magnetron having a short dimension and a long dimension. For edge sputtering of the target, the magnetron is located near the target edge with the long dimension perpendicular to a radius from the rotation center. For center cleaning, the magnetron is located nearer the target center with its long dimension inclined at a smaller angle to the radius from the rotation center, for example, at less than 60°.

Externally controlled actuators may be used to selectively move a magnetron in a direction at least partially radially of a rotating plate on which the magnetron is supported. For example, a liquid or pneumatic actuator located on the plate and driven by a fluid supplied through the rotary shaft to act in opposition to passive biasing means, such as a spring, located on the plate while the actuator and biasing means urge the magnetron in opposed radial directions. The motion of the magnetron may be linear on the plate or be pivoting about a pivot axis on the plate offset from the rotation axis of the plate.

In another set of embodiments, two coaxial shafts are fixed to two inner arms, which support two pivoting outer arms joined in a frog-leg structure to support a magnetron at one or more radial positions determined by the relative rotational phase of the two coaxial shafts. Synchronous rotation of the two shafts causes the magnetron to rotate about the central axis at a fixed radius. Differential rotation of the two shafts causes the radial position to change. One or more differential gear assembly may couple the two coaxial shafts to a first motor controlling the rotation and a second motor controlling the radial position.

In a further embodiment, a cable mechanism includes a cable having one end fixed to a pivoting arm and wound around a pulley on a shaft arm fixed to the rotary shaft. The cable is led up through a passage way in the rotary shaft and has a second end fixed to a deformable coupling in the shaft, for example, a bellows. An externally activated slider mechanism may be coupled through a rotational coupling to the deformable coupling.

BRIEF DESCRIPTION OF THE DRAWINGS

FIG. 2 is a schematic view of an embodiment of a centrifugal dual position magnetron mechanism of the invention.

FIG. 3 is a schematic plan view of the dual position magnetron of FIG. 2 in its outer position.

FIG. 4 is a schematic plan view of the magnetron of FIG. 2 in its inner position.

DETAILED DESCRIPTION OF THE PREFERRED EMBODIMENTS

Figure 1:
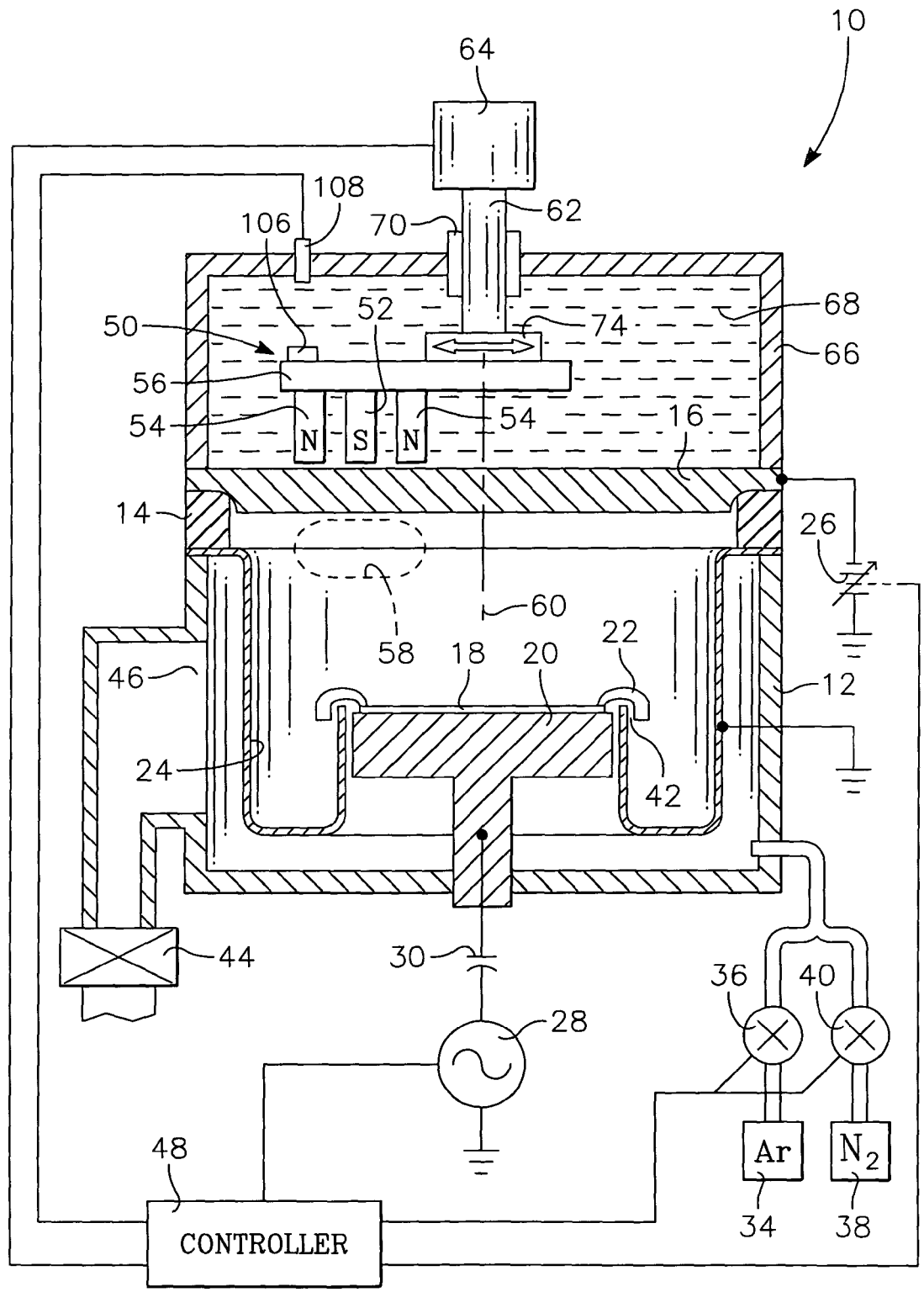
FIG. 1 is a schematic cross-sectional view of a self-ionizing plasma (SIP) sputter reactor.

One general aspect of the invention comprises a two step process including alternating first and second steps. The first step includes sputtering from one annular region of a sputter target, particularly one composed of a refractory barrier material and typically used at least partially for reactive sputter deposition. The second step includes sputtering from at least a remaining portion of the sputter target. Both steps may use the same magnetron by shifting the radial position of the rotating magnetron between the steps. The second step is particularly effective at cleaning the target of redeposited material. Advantageously, in both steps the magnetron is rotated in the same direction about the target center.

For sputter depositing barriers into high aspect-ratio holes, the first step is advantageously performed by scanning a relatively small and unbalanced magnetron near the peripheral edge of the target by rotating the magnetron about the central axis of the target. Then, the magnetron is moved towards the central axis of the target to scan the area close to the target center and the magnetron is scanned in the same azimuthal direction but at a different radius. With the magnetron located near the target center, it is rotated about the target center to provide more uniform cleaning. Although it is typical to continue rotating the magnetron during its radial movement, both the edge sputtering and the center cleaning typically require much longer than a second so the magnetron is rotated many revolutions at each of its two positions.

The mechanism for moving the magnetron can assume many different forms.

One aspect of the invention includes a dual-position centrifugal pivoting magnetron assembly 80, illustrated in the orthographic view of FIG. 2, which is switchable between two rotation radii dependent upon the speed of rotation in a single rotation direction. The magnetron assembly 80 includes a bracket 82 that is fixed to the rotary drive shaft 62 rotating about the central rotation axis 60 of the reactor. The end of one arm of the bracket 82 rotatably supports beneath it a pivot plate 84 through a pivot mechanism 86 that allows the pivot plate 84 to pivot about a pivot axis 88. The pivot plate 84 supports a back plate 90, which is composed of a ferromagnetic material to form the yoke of the magnetron 50. For structural purposes, the back plate 90 can be considered as part of the pivot plate 84 since they pivot together about the pivot axis 88. One bushing 92 is affixed to the bracket 82 between the rotation axis 60 and the pivot mechanism 86 and another bushing 94 is fixed to a mount 95 on the back plate 90. The two ends of a tension spring 96 are attached to the two bushings 92, 94. A first nylon stop 100 is screwed to the pivot plate 84 on one side of the bracket 82 and a second nylon stop 102 is screwed to the back plate 90 on the other side of the bracket 82. Each stop 100, 102 includes a metal knob with a through hole for the screw and a tubular soft, resilient nylon sheath fit on its outside to buffer the impact and shock of the sudden abutment against the bracket 82. The spring 96 biases the side of the back plate 90 with the second stop 102 towards the bracket 82 and hence biases the magnetron toward the rotation axis 60. However, pivoting in the inward direction is limited by the second stop 102 abutting and engaging the bracket 82. On the other hand, rotation of the drive shaft 62 exerts significant centrifugal force on the heavy magnetron 50 and associated elements and pushes the side of the back plate 90 with the second stop 102 away from the bracket 82 in the radially outward direction away from the rotation axis 60. However, pivoting in the outward direction is limited by the first stop 100 abutting and engaging the bracket 82. The speed of rotation determines whether the inward spring biasing or the outward centrifugal force prevails.

The distinguishing terminology is used that the rotary drive shaft 62 rotates while the pivot plate 84 pivots although the two motions are in some sense equivalent. However, a more telling distinction between the two motions is that the magnetron 50 rotates at a constant but selected radius from the rotation axis 60 for a large number of 360° revolutions during processing while the pivot plate 84 pivots over less than about 90° in changing from one radial position to another. The terminology of mechanical bias is understood to mean a predetermined limited force that is applied to a body to urge it to move in the direction of the bias force but the actual movement will typically depend upon countervailing forces opposing the movement.

A counterweight 104 is fixed to the other arm of the bracket 82 and is designed to have the same moment of inertia as the magnetron 50 and associated elements to reduce vibration during rotation. However, since the moment of inertia of the magnetron 50 depends upon its radial position, counterbalancing is improved if the counterweight is subject to the same radial movement with respect to the rotation axis 60. A position flag 106, such as a magnet, is fixed to the backing plate 90, and a position sensor 108, such as a magnetic Hall sensor, illustrated in FIG. 1, is disposed in the roof over the rotating magnetron 50 to allow the controller 48 to determine the current radial position of the magnetron as the rotating magnet 106 either does or does not pass beneath the magnetic sensor 108.

In this embodiment of the invention, varying the rotation rate of the rotary drive shaft 60 will either cause the centrifugal force to overcome the spring bias force to place the magnetron 50 at a first, radially outer position or cause the spring bias force to dominate to place the magnetron 50 at a second, radially inner position. The magnetron position illustrated in FIG. 2 is the OUT position for which the centrifugal force is greater. The OUT position is schematically illustrated in the plan view of FIG. 3, in which the pivot plate 84 is emphasized but simplified. As the rotary drive shaft 62 rotates in one rotational direction at the rate $f_{OUT}$ that is sufficiently high, the centrifugal force on the magnetron 50 is greater than the spring tension and causes the pivot plate 84 and attached magnetron 50 to pivot outwardly about the pivot axis 88 from the bracket 82 to the illustrated outer position. In contrast, in the IN position schematically illustrated in the plan view of FIG. 4, the rotary drive shaft 62 rotates in the same rotational direction but at a sufficiently lower rate $f_{IN}$ that the spring tension is greater than the centrifugal force so that the spring 96 pulls the pivot plate 84 and attached magnetron 50 to pivot inwardly about the pivot axis 88 towards the bracket 82 and to the illustrated inner position. Regardless of the magnetron position, the drive shaft 62 continues to rotate the magnetron 50 about the central rotation axis 62 but the radial displacement of the magnetron 50 from the central axis 62 is greater in the outer position than in the inner position. Thereby, the magnetron 50 scans different areas of the target when it is at different radial positions.

Figure 5:
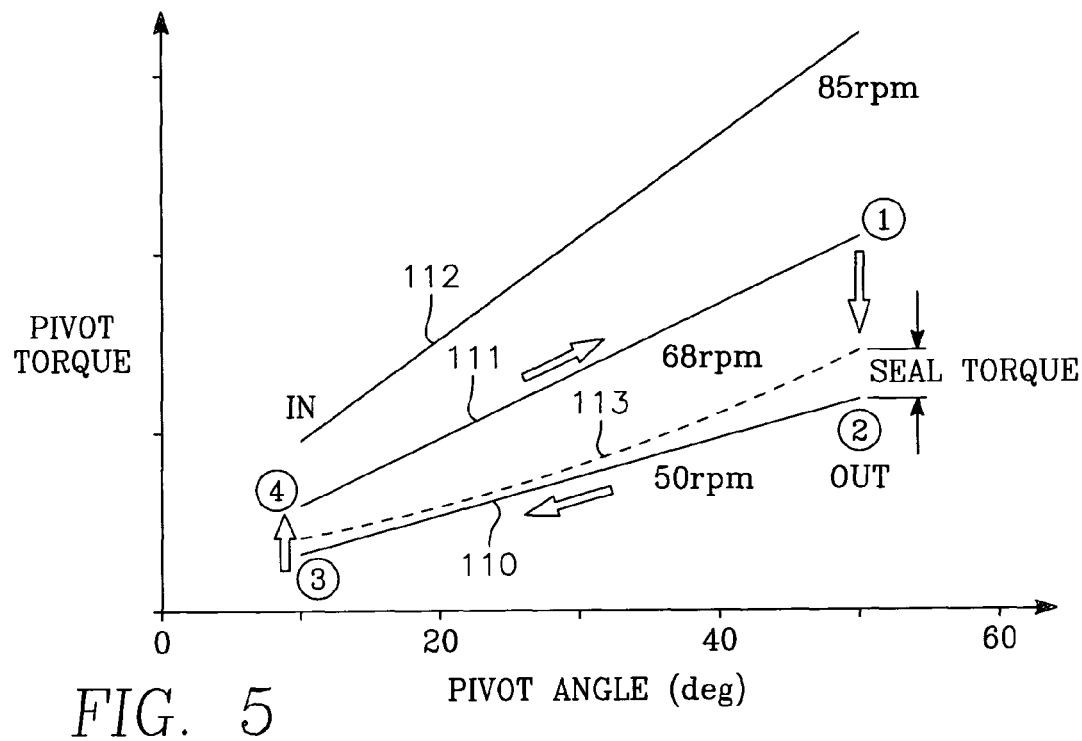
FIG. 5 is a graph useful in explaining the kinetics of the movement of the dual position magnetron.

The kinetics of the magnetron movement will be explained with reference to the graph of FIG. 5. Lines 110, 111, 112 plot the torque about the pivot axis 88 exerted on the pivot plate 84 by the centrifugal force exerted primarily by the heavy magnetron 50 as a function of pivot angle between the pivot plate 84 and the bracket 82 for three values of rotary shaft rotation rate, 50 rpm, 68 rpm, and 85 rpm. The pivot torque, which is always in the outward direction in the illustrated configuration of the mechanism, increases with rotation rate and also increases with pivot angle as the pivot plate 84 moves the magnetron 50 outwardly from the rotation axis 62. Dotted line 113 plots the torque about the pivot axis 88 exerted by the tension in the spring 96 as a function of pivot angle. The spring torque is always in the inner direction. The net torque is the difference between the centrifugal torque and the spring torque and the sign of the difference determines whether the pivot plate 82 pivots inwardly and outwardly. It is noted that both the centrifugal and spring torque are affected by the pivot angle, not only because of the change of bias and centrifugal force with changing spring length and magnetron radius but also by the changing geometry of the torque arm with respect to the bracket's longitudinal axis. Bistable operation is possible if the two rotation rates $f_{IN}$ and $f_{OUT}$, such as 50 rpm and 68 rpm in the graph, are chosen to completely bracket the spring torque 113 for all values of pivot angle between the two stops so that for rotation at the lower $f_{IN}$ the magnetron is torqued all the way to the inner stop and for rotation at the higher $f_{OUT}$ the magnetron is torqued all the way to the outer stop.

The dynamics however are complicated by the torque exerted by the rotational seal between the relatively rotating pivot plate 84 and bracket 82, which is frictional in nature and always impedes any motion. The seal torque is greatest when there is no relative movement and lessens once motion has begun. Assuming that the magnetron is in stable outer position 1 with the bracket 82 abutting the first stop 100 and rotating at $f_{OUT}$=68 rpm, the rotation rate needs to be lowered below the balance point at which the centrifugal torque equals the spring torque by a further rotation decrement that overcomes the seal torque. The magnetron then is temporarily at position 2 at which it is at the outer position but rotating at $f_{IN}$=50 rpm. Thereafter the magnetron quickly moves inward to stable inner position 3 at which the magnetron is at the inner position with the bracket abutting the second stop 102 and rotating at 50 rpm. If 50 rpm is below the break away point at which the seal torque is exceeded, then the magnetron begins moving to position 3 before its rotation rate has reached 50 rpm. Similarly, when it is desired to move outwardly from the stable position 3, the rotation rate must be raised sufficiently for the difference between the centrifugal torque and spring torque to exceed the seal torque, thereby putting the magnetron temporarily at position 4 at which it is rotating at the inner position at 68 rpm. The magnetron then quickly moves outwardly to stable outer position 1.

The transition between the two positions can be speeded if the rotation rate is increased or decreased more than is required to just begin movement. For example, when moving from the outer to inner position, the rotation rate may be decreased from 68 rpm to significantly below 50 rpm to significantly increase the unbalanced torque. When the magnetron has arrived at the inner position, the rotation rate can be decreased to 50 rpm. Similarly, when moving from the inner to the outer position, the rotation rate may be increased from 50 rpm to significantly above 68 rpm to initiate and complete the movement and thereafter may be decreased to 68 rpm or perhaps even lower.

The magnetron movements have been described with reference to FIGS. 2, 3, and 4 without regard to hydrodynamic effects, which may become important when the rotation rates are being changed and before the swirling motion of the cooling water has reached steady state generally following the rotating bracket 82 and magnetron 50. The rotation direction indicated in FIGS. 3 and 4 acts to pull the magnetron 50 through the viscous cooling water. The additional hydrodynamic force upon increasing rotation rate acts to speed up the transition toward the outer position. In contrast, if the rotation direction is opposite that illustrated, it pushes the magnetron 50 through the fluid. When the rotation rate is decreased, the hydrodynamic force more quickly presses the magnetron 50 towards the center position.

Figure 6:
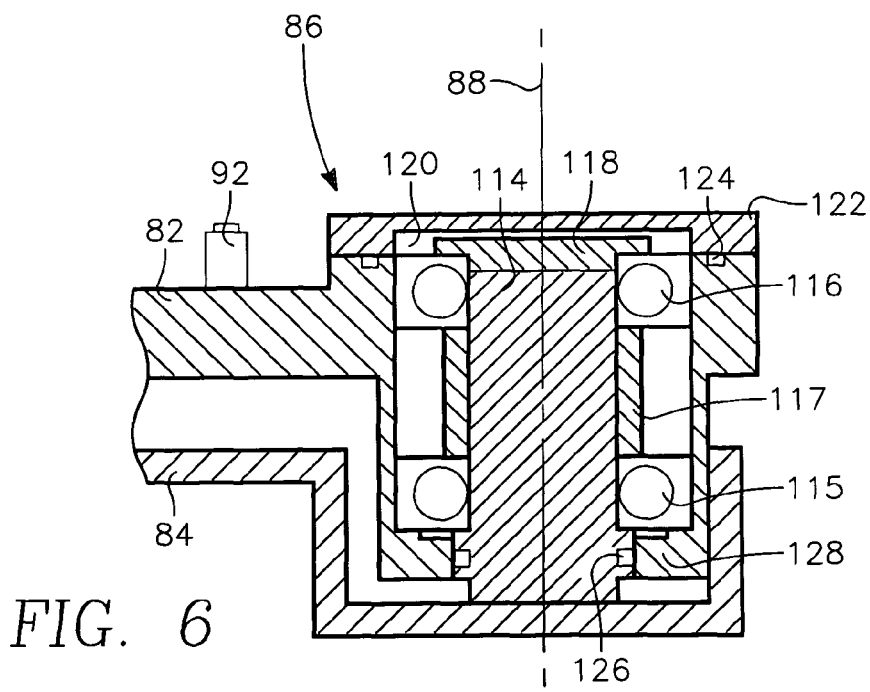
FIG. 6 is a cross-sectional view of an embodiment of the pivoting mechanism useful in a dual position magnetron.

The pivot mechanism must be designed in view of several requirements. It is immersed in the cooling water. It must rotatably support a heavy magnetron with minimum droop and vibration, particularly since magnetrons may need to be rotated in close proximity to the back of the target. The pivoting mechanism should impose a minimum of seal torque and other frictional effects to reduce the required difference in rotation rates. The pivot mechanism 86 illustrated in the cross-sectional view of FIG. 6 provides satisfactory performance. At least one screw fixes a spindle 114 to the pivot plate 84 in alignment to the pivot axis 88. The inner races of a pair of sealed lubricated bearings 115, 116 separated by a tubular spacer 117 are captured onto the spindle 114 by a flange 118 screwed to the spindle 110. The inner races of the bearings 115, 116 are captured on the bracket 82 by an annular preload spring 120 pressed against the axial end of the outer race of the upper bearing 115 by a cap 122 fixed to the bracket 82 by screws. The cavity containing the bearings 115, 116 is sealed on its two ends against the aqueous environment by a static O-ring seal 124 between the bracket 82 and the cap 122 and by a dynamic seal 126 between the lower outer periphery of the spindle 114 and an inwardly extending lip 128 of the bracket 82. To reduce the frictional seal torque, the diameter of the dynamic seal 126 should be minimized.

The nylon stops 100, 102 may provide insufficient shock resistance in view of the heavy magnetron and the fragility of the strong magnetic materials such as NdFeB. Accordingly, it may be desirable to replace the nylon stops with spring-loaded shock absorbers similar to those used on automobiles, which may be mounted either on the bracket or on the pivot plate and back plate to more smoothly engage stops on the other member.

Figure 7:
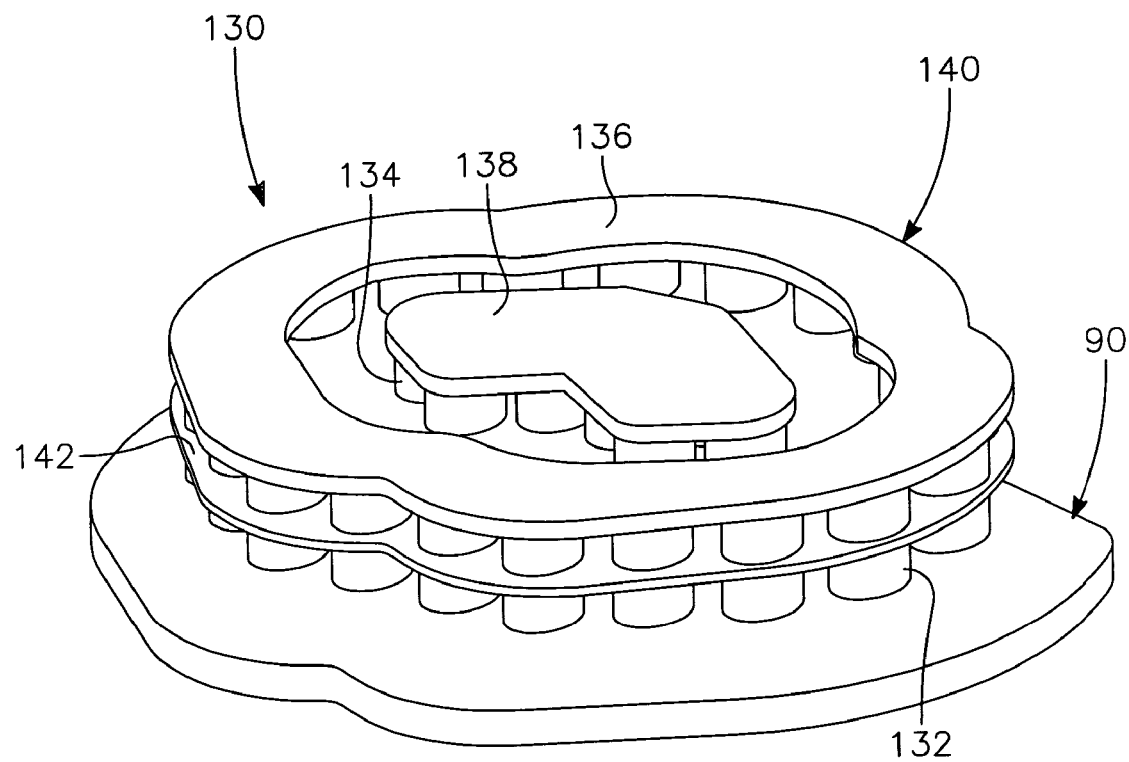
FIG. 7 is an orthographic view of a first embodiment of a magnetron usable with the invention.

A first preferred embodiment of an unbalanced, arc-shaped magnetron 130 is illustrated in the orthographic view of FIG. 7 generally from the bottom of FIGS. 1 and 2. Twenty cylindrical permanent magnets 132 of a first magnetic polarity along the cylindrical axis are arranged in a closed outer band on the back plate 90, which serves as a magnetic yoke as well as a support fixed to the pivot plate 84. Ten magnets 134 of the same design but inverted to provide the opposed second magnetic polarity are arranged in an arc shape within the outer band. The outer magnetic band thus has is greater than the magnetic intensity of the inner magnetic arc by a factor of two so that the magnetron is unbalanced, as has been discussed in the aforecited Fu patent. However, to further emphasize ionized sputtering of the outer periphery of the target and provide further magnetic side confinement, the unbalance may be greater on the arc-shaped side nearer the target edge than on the opposed arc-shaped side nearer the center. The outer magnets 132 are covered by a band-shaped magnetic pole piece 136 and the inner magnets 134 are covered by an arc-shaped magnetic pole piece 138. A smooth convex side 140 of the band-shaped magnetic pole piece 136 is generally aligned with the outer periphery of the target when the magnetron 130 is in the outer position and rotates in that position near the target circumference. A similar smooth convex side exists in the back plate 90. On the other hand, a small concave side is located on the other side of the band-shaped magnetic pole piece 136. The concave side may be smoothly shaped or form a cusp. The pole pieces 136, 138 are arranged to have a nearly constant gap between them which generally defines a region of magnetic field parallel to the inner face of the target and forms a plasma loop adjacent the front face of the target. A non-magnetic separator plate 142 fixed between the back plate 90 and the pole pieces 136, 138 includes apertures in which the magnets 132, 134 snugly fit, thereby aligning them. The operational center of the magnetron 130 is approximated by the center of gravity of the magnets 132, 134, which is within the arc-shaped inner pole piece 138.

Figure 8:
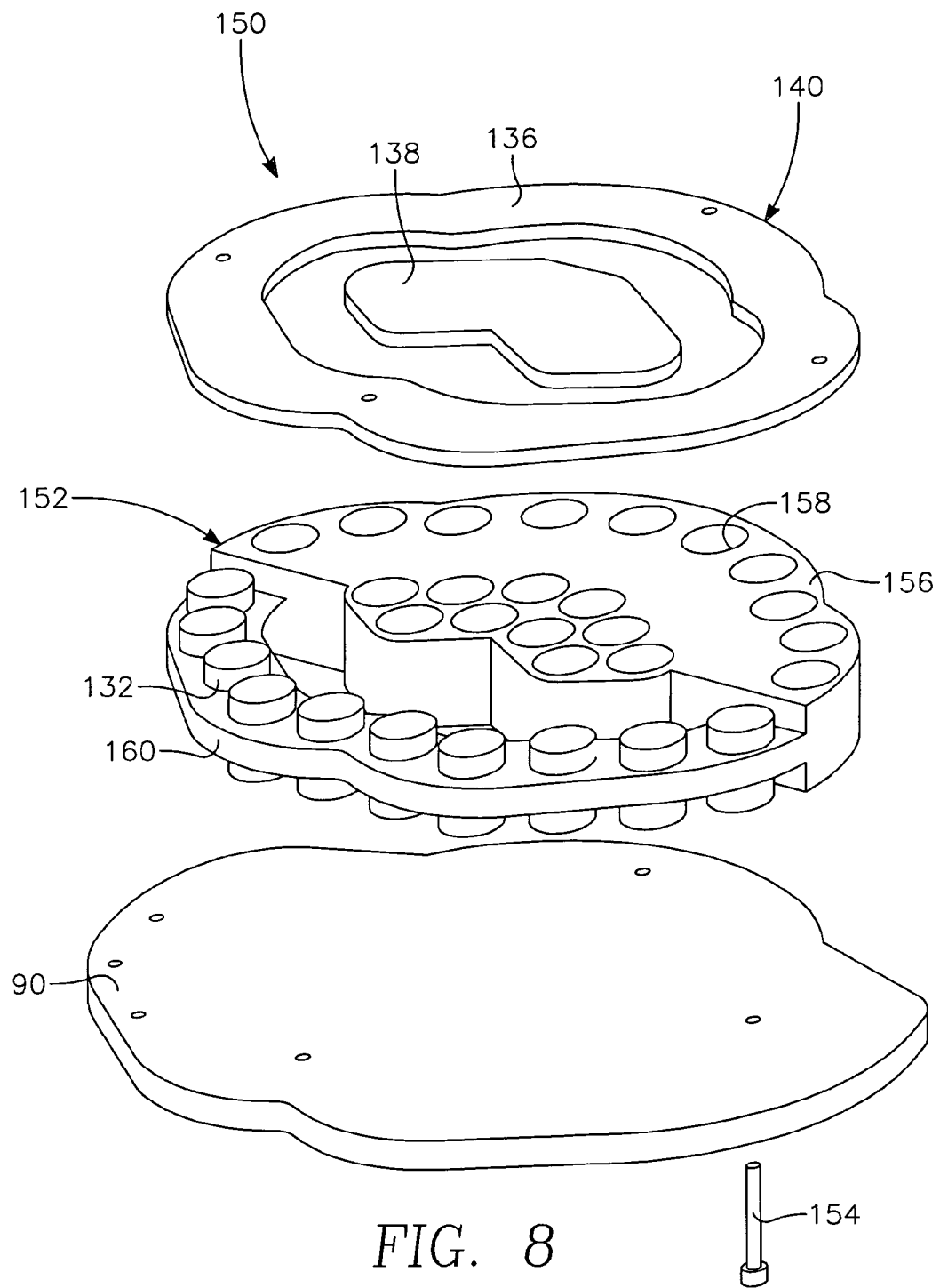
FIG. 8 is an orthographic view of a second embodiment of the magnetron.

Although the arc-shaped magnetron 130 of FIG. 7 has provided satisfactory results, the kinematics of changing between the two magnetron positions are improved if the center of gravity is shifted radially outwardly so that there is a larger change in the moment of inertia as the magnetron moves radially. A second embodiment of a magnetron 150 having an outwardly displaced center of gravity is illustrated in the exploded bottom orthographic view of FIG. 8. A non-magnetic alignment and weight block 152, for example, of non-magnetic stainless steel, replaces the separator plate 142 of FIG. 7. Dowel pins in the block 152 align it with the back plate 90 and the pole pieces 136, 138. Screws 154 pass through the back plate 90 and block 152 and are threaded into the pole pieces 136, 138 to hold the magnetron together.

The block 152 includes a weight portion 156 extending to the outer convex portion 140 of the band-shaped pole piece 136, that is, radially outward when the magnetron 150 is in the outer position. The weight portion 156 has a thickness substantially equal to the length of the magnets and is substantially continuous except for axial through apertures 158 formed for all the unillustrated inner magnets and the unillustrated radially outer half of the outer magnets. The block 152 also includes a semi-collar portion 160 having a reduced thickness and having apertures for the remaining ten outer magnets 132.

The arc-shaped magnetron 150 has a center of gravity that is closer to the smooth convex edge 140 than the magnetron 130 of FIG. 7 and also has a simpler design with fewer parts, which are easier to assemble. The added weight of about 2 kg for the weight portion 156 facilitates transitions between the two stable positions. However, the added weight must be rotatably supported on a movable cantilevered structure at two different radial positions so droop and vibration present greater problems than the lighter design of FIG. 8. Further, the additional weight increases the shock at the stops.

Figure 9:
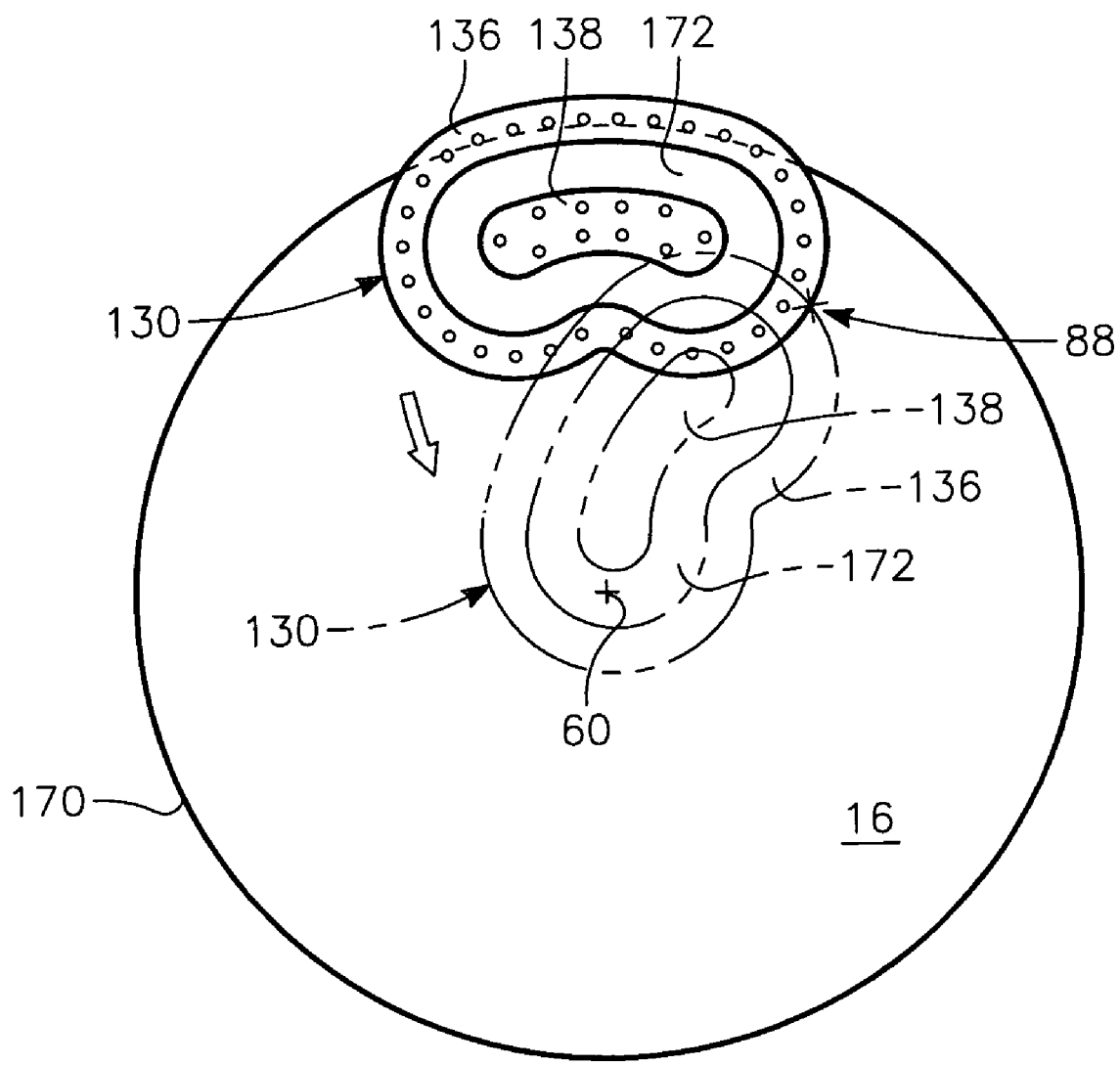
FIG. 9 is a schematic plan view illustrating the two positions of a pivoting, arc-shaped dual-position magnetron.

The arc-shaped magnetron 130 or 150 has an overall shape defined by the outer perimeter of the gap between two pole pieces 136, 138 that is substantially longer in one direction than in the other. This shape is advantageous for the two-step sputter deposition and cleaning process. As illustrated in the bottom plan view of FIG. 9, during the sputter deposition, the arc-shaped magnetron 130 illustrated in solid lines is disposed near an effective edge 170 of the target 16 with its longer dimension aligned along a circumference of the target 16 and perpendicular from a radius extending from the rotation axis 60 to the center of the magnetron and its shorter dimension is aligned generally along that target radius. In particular, the outer portion of the outer pole 136 in the sputter deposition may overlie the effective edge 170 of the target 16. A gap 172 between the two poles 136, 138 generally defines a plasma loop inside the sputter chamber which produces sputtering of the annular region of the target 16 adjacent the plasma loop which extends radially inward from near the target edge 170. In one embodiment of edge sputtering, the plasma tracks scans an annular band that extends in the outer half of the target radius and none of the target within the inner half is scanned.

During the sputter deposition, the RF source 28 strongly biases the wafer 18 to accelerate the sputtered ions deep within the high aspect-ratio holes being conformally coated with barrier material. The magnetron 130 is relatively small but it is rotated about the target center 60 to produce a relatively uniform sputter erosion in the annular band about the target center 60 including the magnetron gap 172. Its small size causes an average sputter rate in the annular band to be relatively small. However, the low deposition is acceptable for barrier layers in high aspect-ratio holes, which need to be thin to leave the bulk of the hole for copper or other metallization.

At the beginning of the cleaning phase, the speed of rotation is decreased and the magnetron 130 swings about the pivot point 88 to a position illustrated by dotted lines closer to the target center 60. In this position, the long dimension of the magnetron 130 is aligned more closely to a radius of the target 16 than to a target circumference, thus allowing a larger radius of the target 16 to be cleaned. As illustrated, the long dimension is inclined at about 45° from the radius from the rotation axis 60 to the magnetron center, but the inclination angle may advantageously be an angle between 0° and 60°. Also advantageously, the magnetron gap 172 in the cleaning position extends from the target center 60 to the gap 172, which defines the plasma loop, in the deposition position. As a result, all of the target radially inwards of the region sputtered in the deposition step is sputtered in the cleaning step. During the cleaning step, the wafer bias may be reduced even to zero to minimize energetic ion flux at the wafer pedestal.

Other types of biasing means than the tension spring 96 illustrated in FIG. 2 may be used. A compression spring can be substituted by moving it to the other side of the bracket 82. A leaf spring or spiral spring can be used, for example, having one fixed near to the pivot axis and the other on the pivot plate 84 or back plate 90. A spring-wound wheel having an axis fixed to one member can be wrapped with a cable that has its other end fixed to the other member. The biasing means described here are all passive though active biasing is possible.

Figure 10:
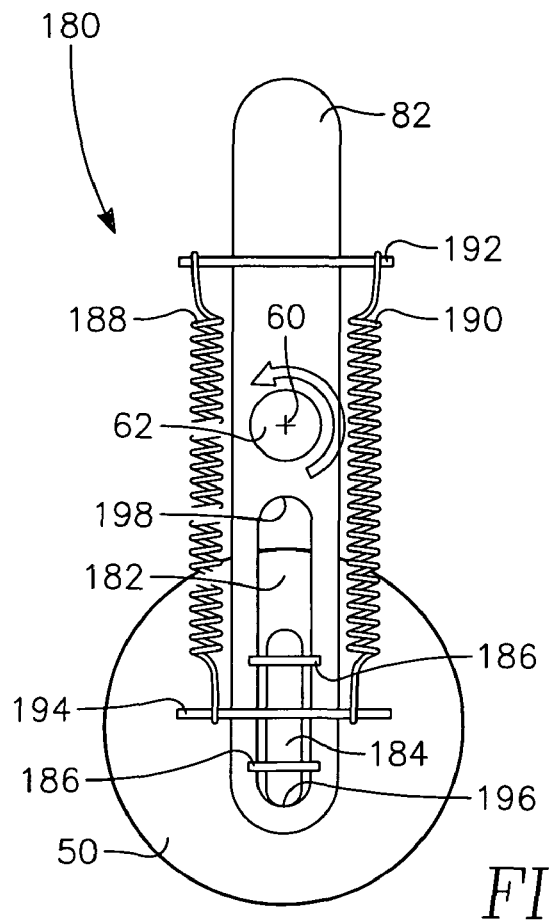
FIG. 10 is schematic plan view of a centrifugal slider for a dual position magnetron of the invention.

In another embodiment of a centrifugal magnetron illustrated in the plan view of FIG. 10, a linear slider mechanism 180 includes the bracket 82 fixed to and rotating with the rotary drive shaft 62 about the target center axis 60. A radially extending slot 182 is formed in the bracket 82 to closely accommodate and align an oval-shaped support pier 184 which can slide radially within the slot 182. The support pier 184 supports the magnetron 50 beneath the bracket 82 while two support beams 186 slidably support the support pier 184 on the upper surface of the bracket 82 through low-friction interfaces. An unillustrated counterweight may be attached to the end of the bracket 82 opposite the slot 182, either fixed thereto or radially movable in correspondence to the movement of the magnetron 50. Two springs 188, 190 are connected on their respective ends to a first cross-arm 192 fixed to the bracket 82 and a second cross-arm 194 fixed to the support pier 184 to thereby bias the magnetron 50 towards the target center 60. However, at a sufficiently high rotation rate, the centrifugal force exerted on the rotating magnetron 50 is sufficient to overcome the bias force and cause the magnetron into the illustrated outer position with the outer end of the support pier engaging an outer end 196 of the slot 162. But, at a sufficiently low rotation rate, the bias force overcomes the centrifugal force to cause the magnetron to move to its inner position with the inner end of the support pier 184 being stopped by an inner end 198 of the slot 182.

It is possible to design a centrifugally driven magnetron in which the outer position is favored by the biasing means and lower rotation rates and the inner position is favored by the increased centrifugal force at higher rotation rates.

The stops provide definite bistable operation. It is however possible to more finely balance the centrifugal force against the biasing means so that the magnetron can be rotated at more than two radial positions without the use of intermediate stops.

Figure 11:
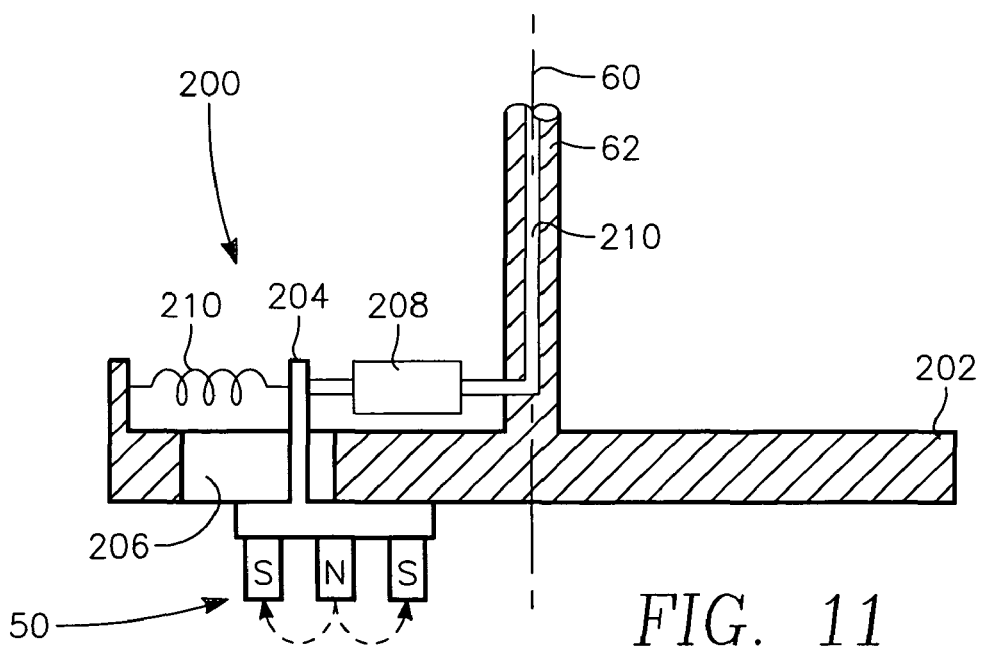
FIG. 11 is a schematic cross-sectional view of a mechanism including an actuator for moving the radial position of a magnetron.

Other position adjusting mechanism can be applied to the invention. For example, Fu et al. in U.S. Pat. No. 6,692,617 disclose an actively controlled adjusting mechanism 200, illustrated in the schematic cross sectional view of FIG. 11. A support plate 202 is fixed to the end of the rotary drive shaft 62 extending along target axis 60 to support the magnetron 50. A support pier 204 supporting the magnetron 50 on the rotating support plate 202 slides in a radial slot 206 in the support plate 202 that guides the support post 204 in the radial direction. A pneumatic or hydraulic actuator 208 having an actuator arm connected to the support pier 204 is supported on the support plate 202 and is powered through a fluid line 210 formed in the rotary shaft 62 and connected through an unillustrated rotary coupling to a fluid power source. A spring 210 or other biasing means connected between the support pier 204 and the support plate 202 may be used in opposition to a force applied to the support post 204 by the actuator 208. However, a separate biasing means can be eliminated if the actuator 208 acts in opposition to centrifugal force. In any case, application of fluid force through the actuator 208 can move the magnetron 50 in a radial direction of the rotating bracket 82 so that the magnetron can be placed at least two radial positions, one favoring sputtering of the edge, and the other favoring the center of the target 16. The actively controlled adjusting mechanism 200 allows the radial adjustment of the magnetron 50 regardless of rotation rate. If the adjusting mechanism 200 has more than two positions, the radial position of the magnetron 50 can be more finely controlled.

One actuator-based design includes the pivoting arc-shaped magnetron of FIG. 2 with approximately the same geometry but without the need for bistable modes. Instead, rather than relying upon changes in rotation rates to control the rotation radius, an externally controlled actuator, for example, connected between respective pivots on top of the stop 100 and on the side of the bracket 82 opposite the pivot axis 88 and selectively supplied with pneumatic or hydraulic force through the fluid line 210 in the rotary shaft 62, as previously described with reference to FIG. 11. The spring 96 may no longer be needed. However, if the actuator exerts force only upon extension, a spring may bias the backing plate 90 in the opposite direction, for example, by being connected between the above mentioned pivots. However, centrifugal force along may provide the required biasing.

Rosenstein's bi-directional centrifugal magnetron may also be used to alternate between sputter deposition and target cleaning although reversing directions impacts operational throughput.

Figure 12:
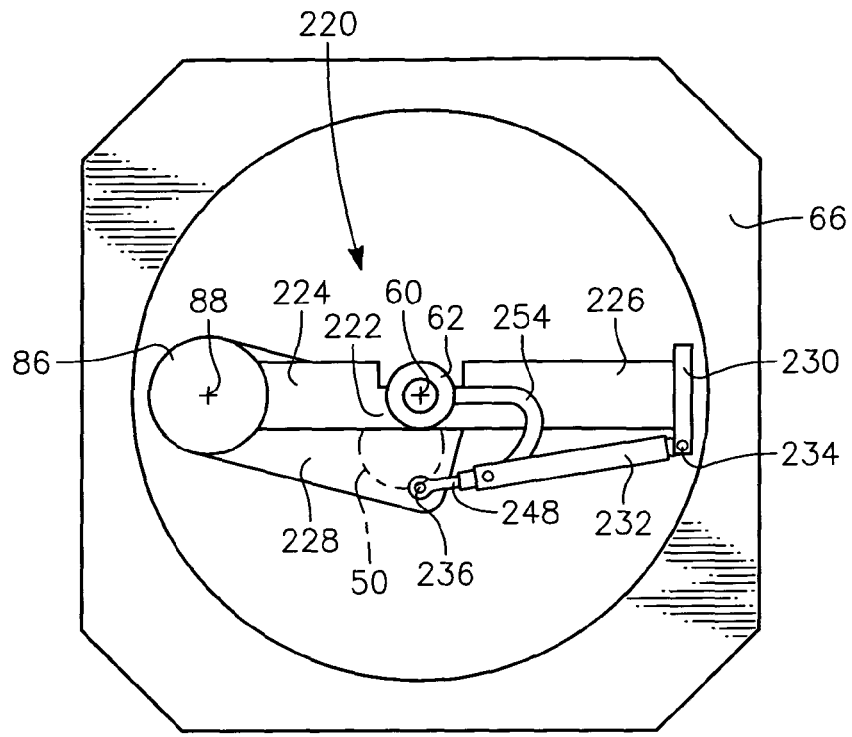
FIGS. 12 and 13 are plan view showing a pivoting mechanism respectively in the contracted and expanded position of the magnetron from the center.

The performance of an selectable position magnetron based on an actuator is improved by designing the mechanism to optimize the performance of the actuator. A continuously variable two-dimensional scannable magnetron assembly 220 illustrated in the plan view of FIG. 12 includes a cross bracket 222 having two arms 224, 226 of approximately equal length. The pivot mechanism 86 is fixed to the end of the first arm 224 to pivot a pivot arm 228 about the pivot axis 88. The magnetron 50 is suspended from the distal end of the pivot arm 228 and, if desired, can be configured to swing beneath the rotation axis 60. A mount 230 is fixed to end of the other arm 226 and a hydraulic or pneumatic actuator 232 whose two ends are respectively pivotally connected to the mount 230 and to the distal end of the pivot arm 228 through two pivot joints 234, 236.

Figure 13:
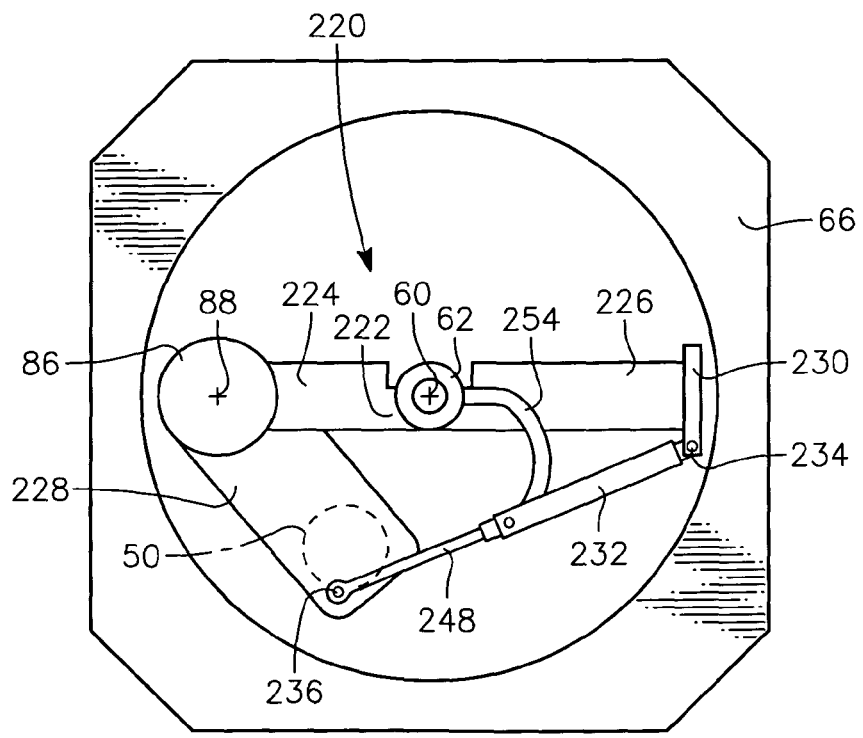

The hydraulic or pneumatic actuator 232 can be externally controlled to vary the separation and relative orientations of the cross bracket 222 and the pivot arm 228 and hence the radial position of the magnetron 50. The magnetron assembly 220 is shown with its actuator 232 in a retracted state causing the magnetron 50 to be disposed near its radially innermost position. In contrast, the magnetron assembly 220 is shown in FIG. 13 with its actuator 232 in an expanded state causing the magnetron 50 to be disposed near its radially outermost position.

Figure 14:
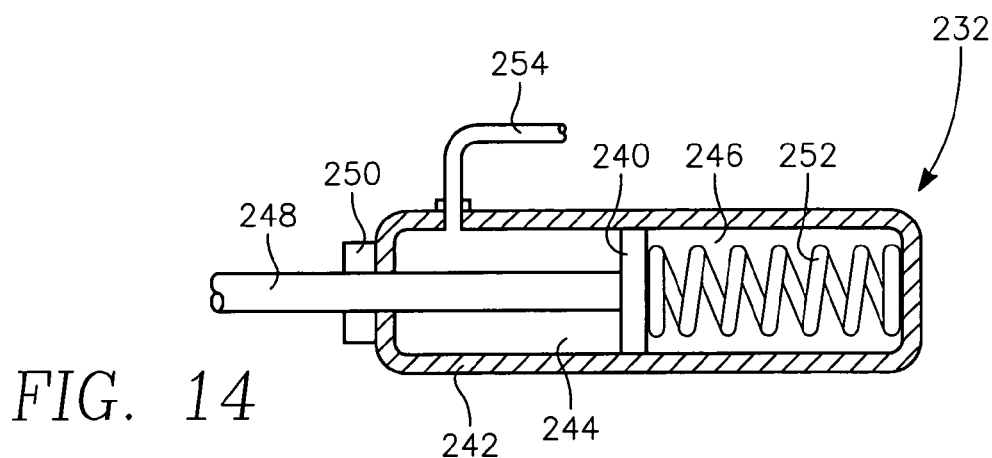
FIG. 14 is a cross-sectional view of a pneumatically operated actuator.

One design of the hydraulic actuator 232 is schematically illustrated in the cross-sectional view of FIG. 14. A piston 240 is closely fit within the interior of a generally tubular housing 242 to slide along the axis of the housing 242 but to provide a fluid seal to divide two compartments 244, 246. An actuator rod 248 is fixed to the piston 240, extends through the first compartment 244 along the axis of the housing 242, and passes through the end of the housing 242 through a fluid seal 250. A compression spring 252 within the second compartment 252, which is filled with a compressible gas or is freely vented to the outside, biases the piston 240 in an outward direction of the actuator rod 250. An flexible hydraulic line 254 supplies a pressurized fluid, preferably a liquid such as water, into the first compartment 244 in opposition to the compression spring 252. However, the fluid may be a pressurized or depressurized gas to effect a pneumatic actuator. The hydraulic line 254 is connected to an axial hydraulic conduit in the rotary shaft 62. An increase in fluid pressure or volume moves the actuator rod 248 inwardly while a decrease allows the compression spring 252 to move the actuator rod 248 outwardly. Other actuator designs are possible. For example, the spring 252 may be a tension spring if placed in compartment 244 with the output rod 248 or if both the spring 252 and the hydraulic supply line 254 are placed in compartment 246 opposite the output rod 248.

Figure 15:
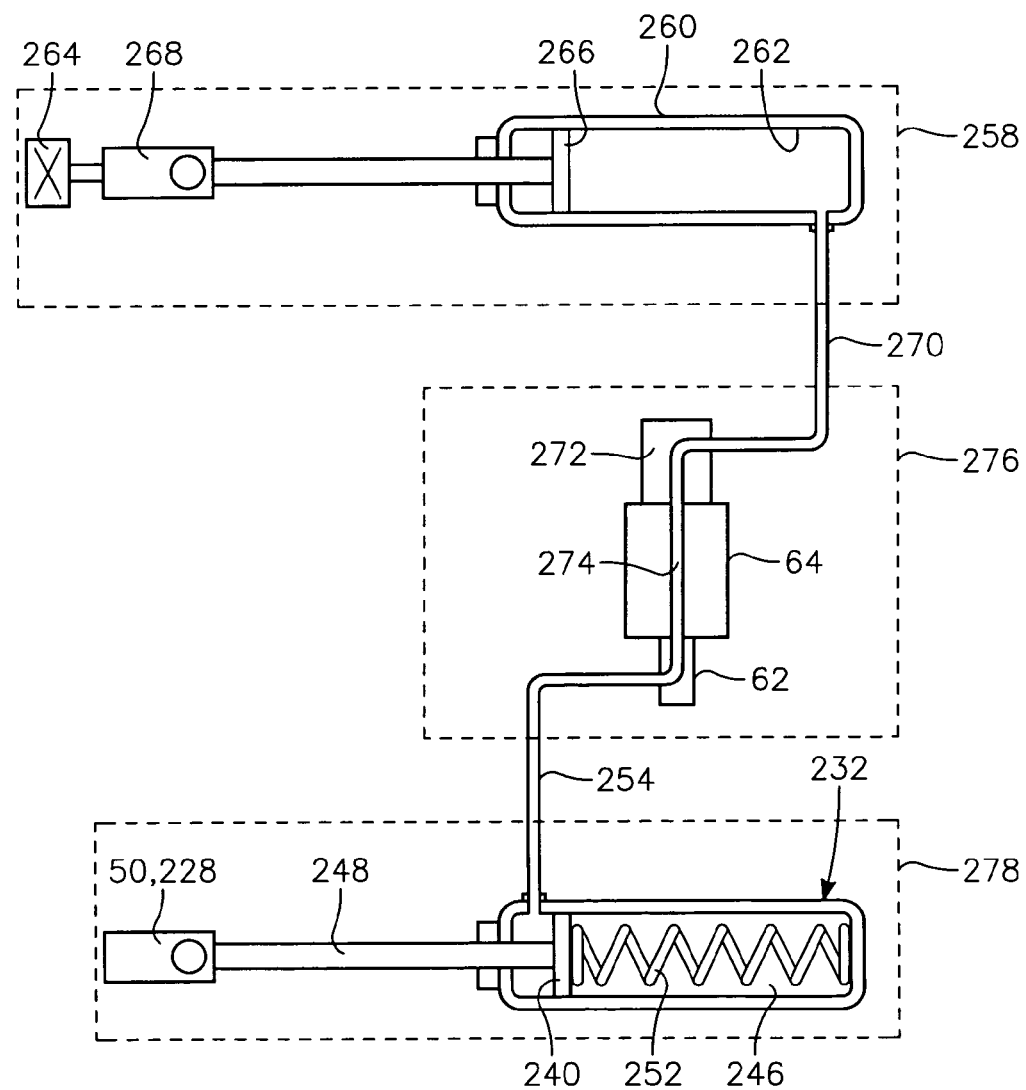
FIG. 15 is a schematic illustration of a slave/master pneumatic system for the actuator of FIGS. 12 through 14.

The actuator 232 is preferably controlled by a master-slave configuration of hydraulic cylinders schematically illustrated in FIG. 15. As part of a hydraulic box 285, a master hydraulic cylinder 260 has a fluid compartment 262 in fluid communication through the hydraulic supply line 254 with the fluid compartment 244 of the actuator 232, which acts as the slave hydraulic cylinder. A stepper motor 264 drives a piston 266 in the master hydraulic cylinder 262 through a worm gear 268. A master hydraulic line 270 connected to the fluid compartment 244 of the master cylinder 260 is connected to the hydraulic conduit supply line 254 to the actuator 232 through a rotary union 272 and a hydraulic conduit 274 in the rotary shaft 62 to form a source assembly 276. A similar fluid connection is used for one of the supply lines for the backside cooling bath 68. Any movement of the piston 266 in the master cylinder 266 produces a complementary movement of the piston 244 in the actuator 232 in a magnet mechanism 278 and hence corresponding movement of the distal end of the pivot arm 228 connected to the output rod 248 of the actuator and the attached magnetron 50 are swung radially inwardly and outwardly with respect to the chamber center 60.

Another class of embodiments more positively control the movement of the magnetron. A symmetric concentric shaft drive 280 is illustrated in the elevational view of FIG. 16. A rotational drive motor 282 drives an output gear 284 engaged with two equally sized drive gears 286, 288. Each drive gear 286, 288 drives a respective first input shaft 290, 292 in a respective drive differential gearbox 294, 296. Each differential gearbox 294, 296 also includes respective second input shafts 298, 300 engaged with respective opposed bevel gears 302, 304 of a bevel gear assembly. A differential motor 308, preferably a bi-directional stepper motor, drives a central bevel gear 310 engaged with the two opposed bevel gears 302, 304 of the bevel gear assembly.

The two differential gearboxes 294, 296 also include respective output shafts 314, 316 connected to respective toothed capstan or gears 320, 322. As will be explained in detail later, the differential gearboxes 294, 296 are designed to combine the rotations of their respective pairs of input shafts 290, 298 and 292, 300 onto their respective output shafts 314, 316. A ribbed inner shaft drive belt 324 fixed is wrapped around the first capstan 320 and a toothed capstan or gear 326 on an inner drive shaft 328 penetrating the chamber and connected to a inner arm 330 controlling the magnetron position. Similarly, a ribbed outer shaft drive belt 332 is wrapped the second capstan 322 and a toothed capstan or gear 334 on an outer drive shaft 336 penetrating the chamber and connected to a second inner arm 338 associated with the magnetron movement. Other non-slipping connections including direct gear connections may be substituted for the drive belts 324, 332.

Figure 17:
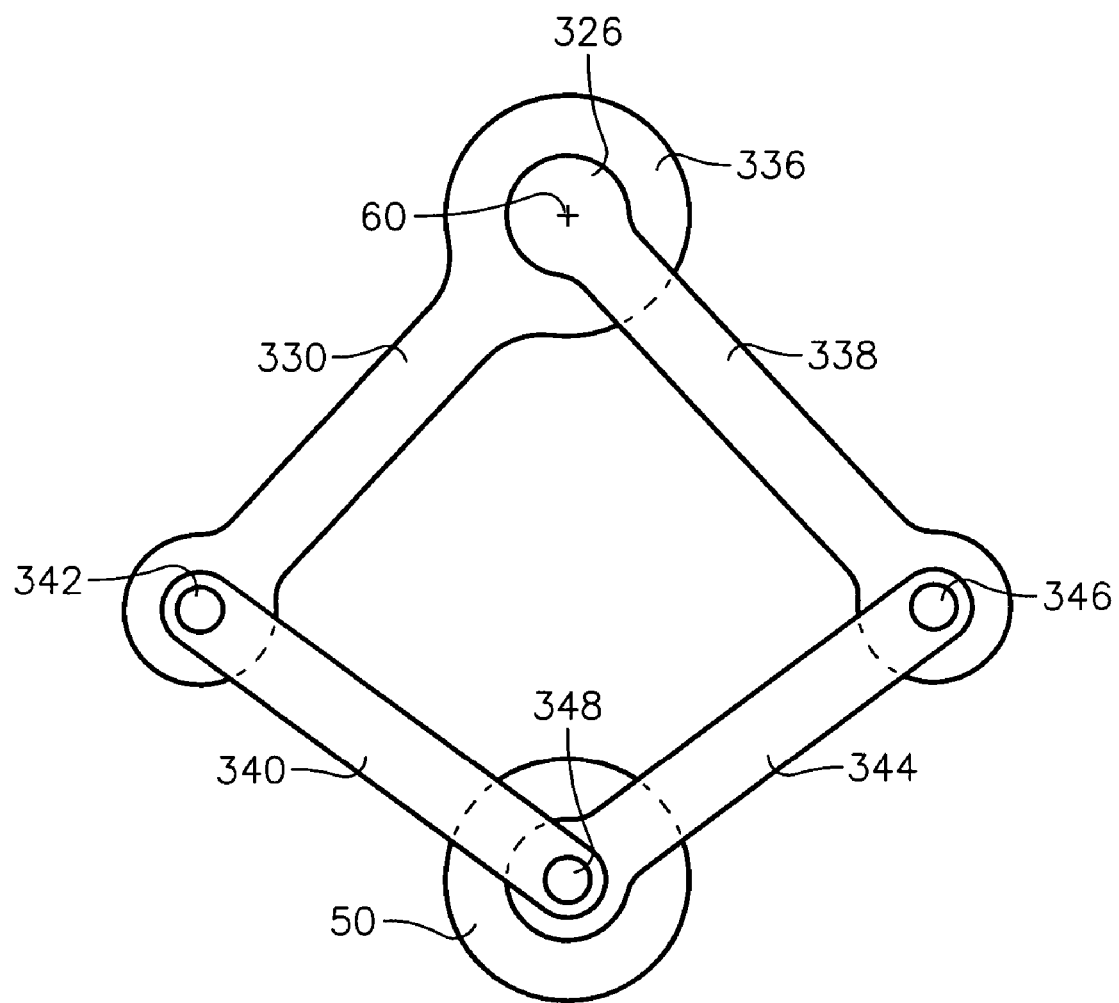
FIG. 17 is a schematic plan view of a frog-leg mechanism usable with the concentric shaft drive of FIG. 16.

As illustrated in the partially sectioned plan view of FIG. 17, the magnetron 50 is mounted at the end of a frog leg structure in which the first inner arm 330 radially extending from the end of the inner shaft 328 is pivotally connected to a first outer arm 340 through a first pivot joint 342 and the second inner arm 338 radially extending from the outer shaft 336 is pivotally connected to a second out arm 344 through a second pivot joint 346. The first and second outer arms 340, 344 have ends pivotally connected together through a third pivot joint 348, beneath which is suspended the magnetron 50. If the shafts 328, 336 are rotating at equal rotation rates, the magnetron 50 rotates at a constant radius from the chamber axis 60, along which the shafts 328, 336 are coaxially aligned. If the two shafts 328, 336 rotate differentially, the magnetron 50 moves toward or away from the central axis 60. In one embodiment of operating the variable position magnetron, the shafts 328, 336 are most of the time rotating at the same rotation rate with the magnetron 50 disposed at a fixed radial position from the chamber center 60. However, at predetermined times, one shaft 326, 336 is rotated differentially with respect to the other shaft 336, 326 to move the magnetron 50 radially inwardly or outwardly.

The inner and outer shafts 328, 336 are coaxial about the central axis 60. The outer shaft 336 is rotatably supported on the chamber by two sets of bearings 350, 352 and is sealed to the chamber by a dynamic water seal 354. Similarly, the inner shaft 328 is rotatably supported on the inside of the outer shaft 336 by two sets of bearings 356, 358 and is sealed to it by a dynamic water seal 360.

Figure 18:
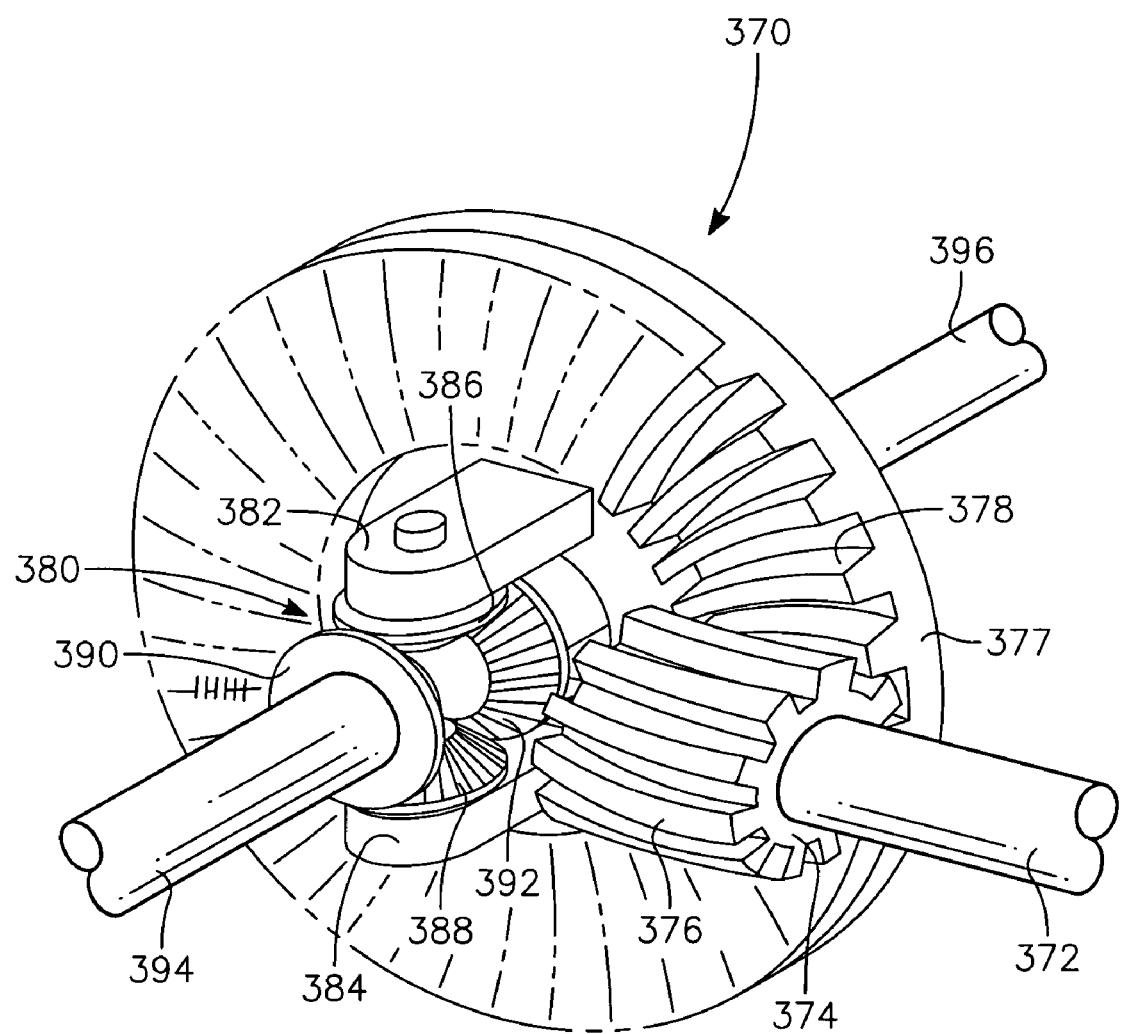
FIG. 18 is an orthographic view of a differential gear system.

One form of the differential gearboxes 294, 296 is based on a differential gear system 370 illustrated in the orthographic view of FIG. 18 and derived from an automotive differential. An output shaft 372 has a spur gear 374 with teeth 376 extending generally along the axis of the output shaft engaged with a ring gear 377 supported by unillustrated means to rotate about an axis perpendicular to the axis of the output shaft 372. Teeth 378 of the jring gear 377 extend generally radially from its rotation axis. A rotating double bevel gear assembly 380 is supported near the center of the face gear 377 by two brackets 382, 384 rotatably supporting two opposed freely rotating beveled input pinion gears 386, 388 having rotation shafts parallel to the face of the face gear 376. As a result, the input pinion gears 386, 388 rotate with the face gear 377 about it central axis. The input pinion gears 386, 388 each engage two input bevel gears 390, 392 respectively fixed to the ends of two input shafts 394, 396 supported by unillustrated means to rotate perpendicularly to the axis output shaft 362. In the automotive application, the shaft 372 is the drive shaft connected to the engine and the two shafts 394, 396 are drive axles connected to the two wheels. In the concentric shaft drive application, the input shafts 394, 396 are ultimately driven respectively by the two motors 282, 308 and the output shaft 372 drives one of the coaxial shafts 326, 336. If one input shaft 396 is not rotating, the rotation of the other input shaft 394 is directly and proportionately coupled into the output shaft 372 taking into account the total gear ratio between the input bevel gear 390 and the spur gear 376 on the output shaft 372. There are other types of differential gearboxes which may be used in the light-duty application of a magnetron drive.

Returning to FIG. 16, the two input gears 286, 288 and the two differential gearboxes 294, 296 are matched. If the differential motor 308 is not rotating, the equal though opposite rotations of the input shafts 286, 288 cause the two coaxial shafts 328, 336 to rotate in synchronism at the same rotation rate in the same direction. Any rotation of the differential motor 308 causes a differential rotation between the two coaxial shafts 328, 336.

In one mode of operation, the differential motor 314 moves the inner and outer shafts 328, 336 relative to each other to select a radial position for the magnetron 50. With the magnetron 50 at that radial position, the rotation drive motor 282 rotates the two coaxial shafts 328, 336 in synchronism with each other so as the azimuthally rotate the magnetron 50 at a fixed radial position for one or more revolutions. In another mode of operation, the rotation drive and differential motors 282, 314 simultaneously move the magnetron azimuthally and radially. However, the joint central rotation rate is typically at least ten times the relative rotation rate.

Figure 16:
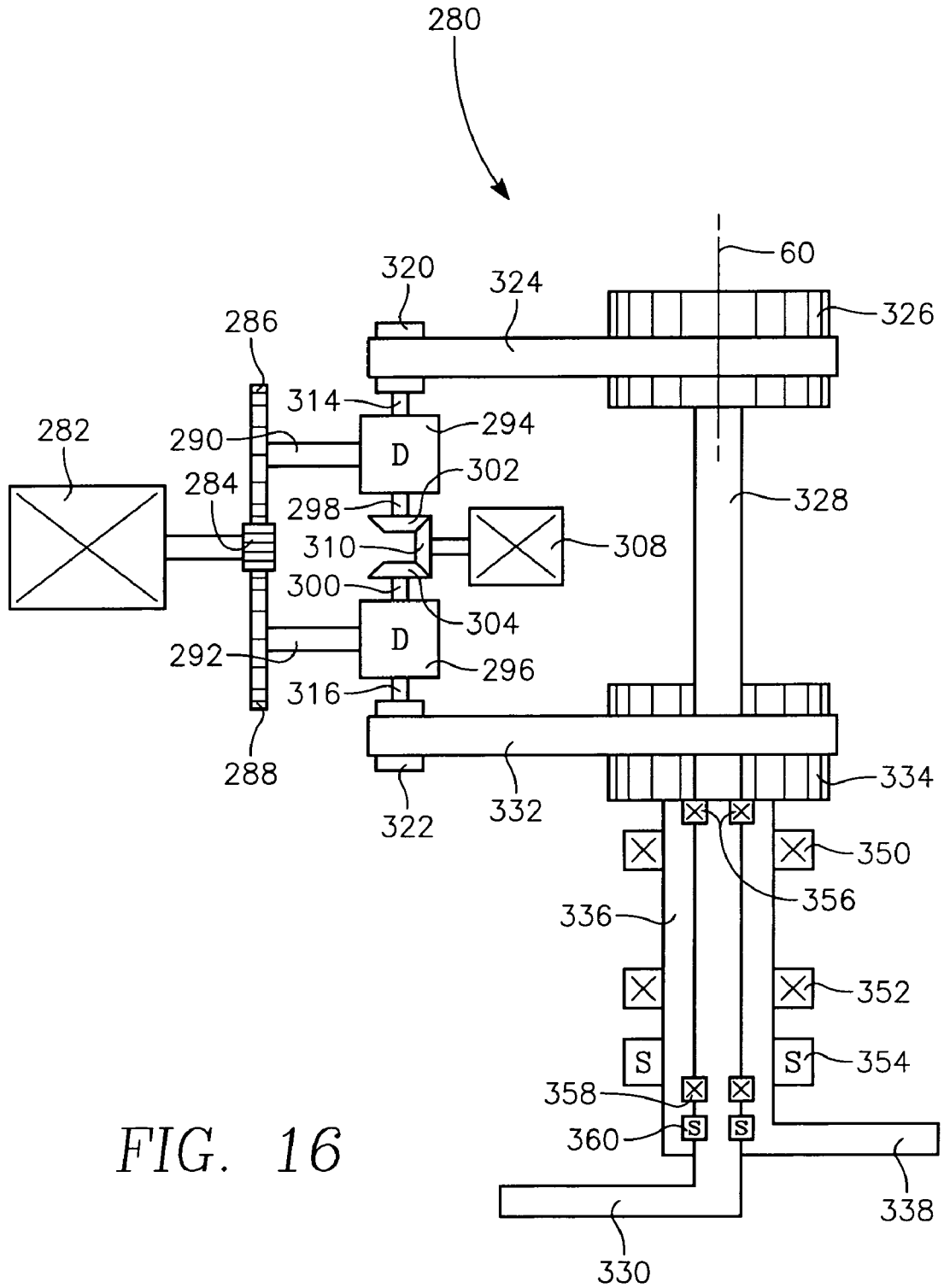
FIG. 16 is a schematic cross-sectional view of a symmetrical concentric shaft drive for magnetron movement mechanism providing continuously variable radius.
Figure 19:
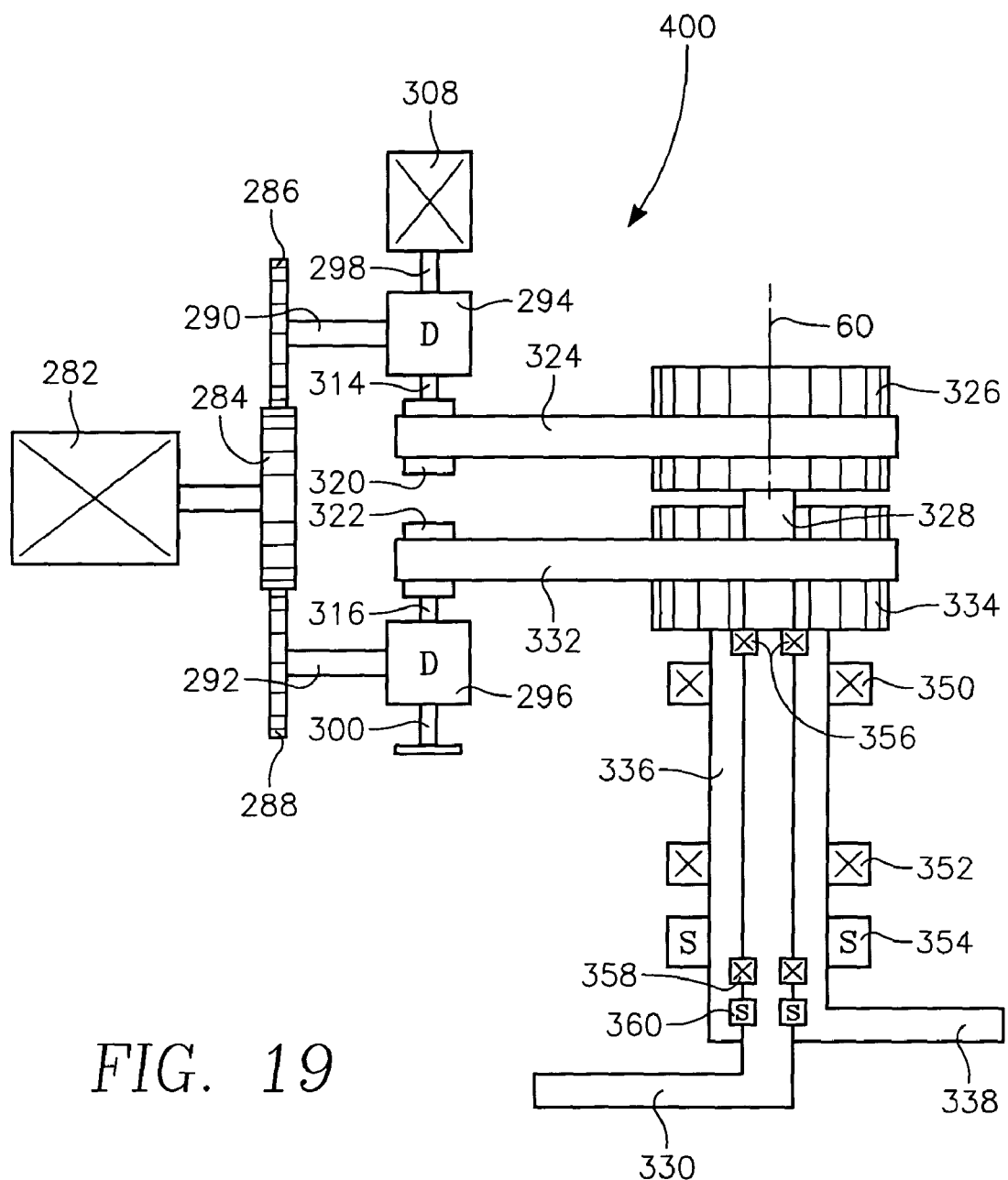
FIG. 19 is a schematic cross-sectional view of an asymmetrical concentric shaft drive which is a variation of the drive of FIG. 16.

An asymmetrical concentric shaft drive 400 is illustrated in FIG. 19 shares many common parts with the symmetrical concentric shaft drive 280 of FIG. 16. However, its differential motor 308 is instead connected to the input shaft of the first differential gearbox 294 without passing through the offset bevel gear system, which is omitted in this embodiment. Also, the input shaft 300 of the second differential gearbox 296 may be fixed. Alternatively, directly coupled gears or other means may couple the drive gear 288 to the second capstan 330 without intervening differential gears but with gear ratios chosen to match the gear ratio of the first differential gearbox 294. Of course, the differential motor 314 and the fixed drive differential gearbox may be switched between the inner and outer shaft drive belts 324, 332 and associated gears and shafts.

Figure 20:
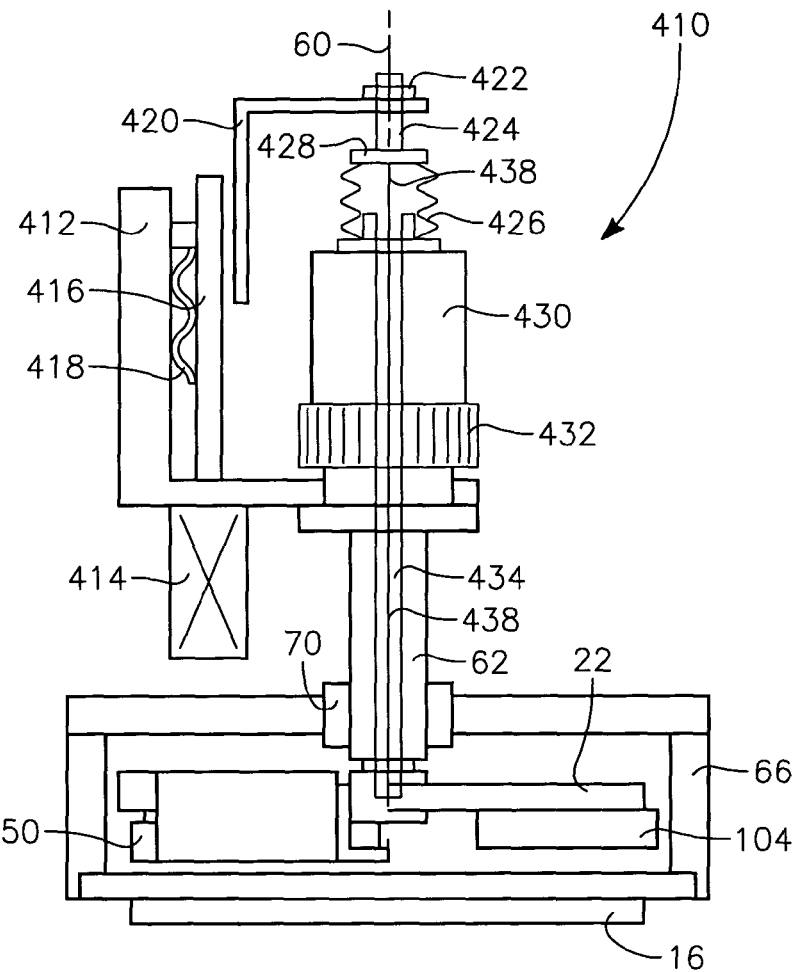
FIG. 20 is a schematic cross-sectional view of a cable drive for magnetron movement providing continuously variable radius.

Another mechanism for imparting radial motion on the rotating magnetron is a cable drive 410 schematically illustrated in the cross-sectional view of FIG. 20. A slider bracket 412 is rigidly fixed on the top of the sputter reactor and mounts a motor 414, preferably a bi-directional stepper motor, and a worm gearbox 416 driving a worm nut assembly 418 vertically along the slider bracket 412. An arm 420 fixed to the worm nut 418 supports a rotation coupling 422 or swivel from which a hanger 424 suspends and freely rotates about the central axis 60 of the sputter reactor. A bellows 426 having a sealed bellows end plate 428 is fixed to the rotary shaft 62 and a capstan 430 rotating the rotary shaft 62 from an unillustrated motor and belt. Cooling water is supplied to the interior of the coolant chamber 66 through a rotary union 432 vertically fixed on the slider bracket 412 and a vertical cooling conduit 434 in the rotary shaft 62. The cooling water may extend into the interior of the bellows 426. A cable 438 is fixed to bellows end plate 428 and extends downwardly, for example, through the cooling conduit 434, to the magnetron cross bracket 222 supporting the magnetron 50 through the pivot plate 228, which is not clearly illustrated here.

Figure 21:
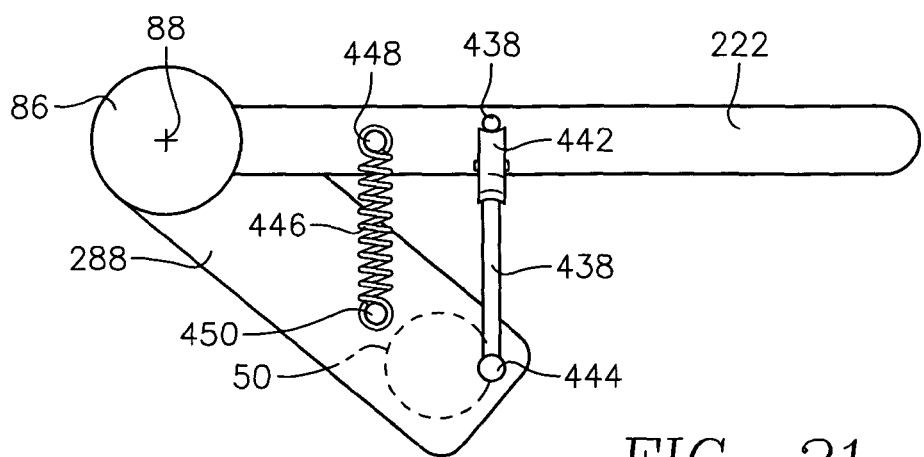
FIG. 21 is a plan view of the pivoting arms of the cable drive of FIG. 20.

The cable 438 rotates with the bellows 426 and the rotary shaft 62 but is raised and lowered by action of the slider mechanism 414, 416, 418 as accommodated by the expansible bellows 426. The other end of the cable 438, as illustrated in the plan view of FIG. 21, is wound around a pulley 442 having a horizontal rotation axis to extend horizontally to a post 444 on the pivot plate 288 to which it is fixed. The cable 438 may be wound around an additional intermediate pulley mounted on the cross bracket 222 with a vertical rotation axis to accommodate the changing angular orientations of the cross bracket 22 and the pivot arm 288. A spring 446 having ends fixed to posts 448, 450 mounted in the cross bracket 222 and the pivot plate 288 biases the pivot plate against the tensile force exerted on it by the cable 438. In the illustrated geometry, the spring 446 is a compression spring but the geometry can be modified to accommodate a tension spring. As the cable 438 is wound in and out, the magnetron 50 supported near the end of the pivot plate 288 is moved radially toward or away from the central axis 60 of the chamber.

The concentric shaft drives 280, 400 of FIGS. 16 and 19, and the slider drive 410 of FIG. 20 have the advantage that a direct mechanical drive is established between the radial position of the magnetron and an externally controlled and observable drive mechanism. The hydraulic drive 220 of FIG. 12 lacks such a direct mechanical connection and leaking hydraulic fluid or deformed hydraulic lines may cause a loss of calibration.

The continuously variable radius of magnetron rotation afforded by the different actuator embodiments affords additional flexibility in the operation of the magnetron. It can emulate the centrifugal magnetron of fairly large size to perform sputtering at one radius and cleaning at another radius. The tantalum sputtering of Rosenstein required central sputtering and peripheral cleaning while the advanced tantalum sputter described above prefers peripheral sputtering and central cleaning. Even for dual-radius operation, the continuously variable mechanism allows recipes for one or more processes to be easily developed for recipes with sputtering and cleaning radii optimized for the process without the need to change out mechanical parts.

It is also possible to further reduce the size of the magnetron to allow further increases in effective local target power densities and hence increases in plasma density and ionization fraction. The small magnetron may be circular to maximize magnetic fields. Nonetheless, uniform sputter deposition or target erosion can be achieved by sputtering at multiple radii of the target over a wide target band. Similarly, cleaning over a large area can be achieved by cleaning at multiple radii.

Figure 22:
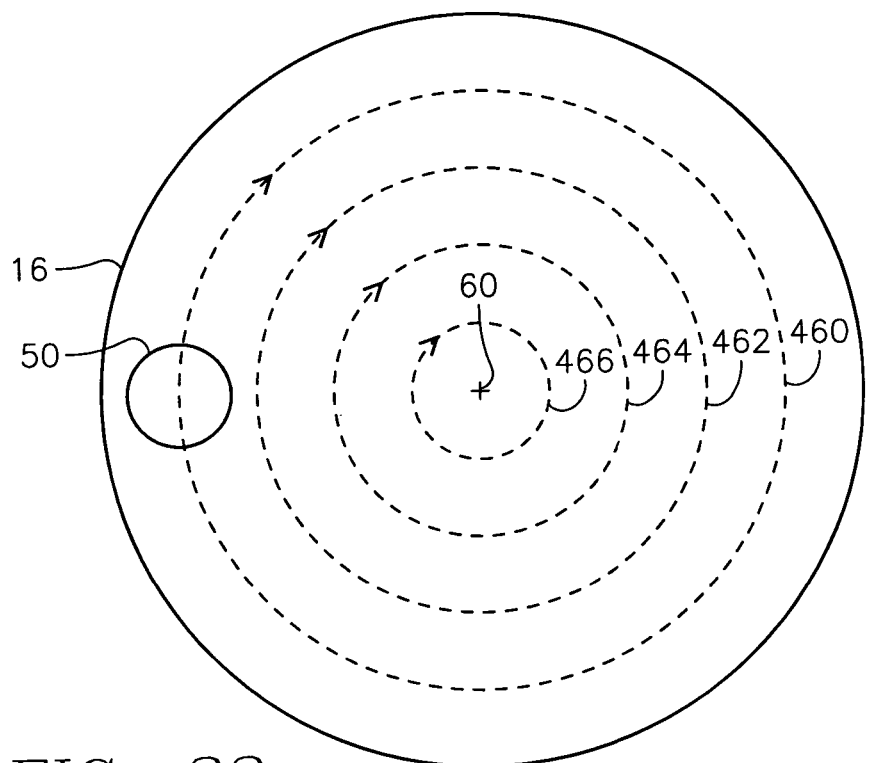
FIG. 22 is a schematic plan view of multiple concentric magnetron tracks allowed by the continuously variable actuator drive of the invention.

As illustrated schematically in the plan view of FIG. 22, the magnetron 50 can be scanned about the target center 60 along multiple, for example, three circular tracks 460, 462, 464 under conditions favoring sputter deposition. The tracks 460, 462, 464 may be radially spaced, for example, by between one or two times the effective diameter of the circular magnetron 50 determined by its magnetic field on the target sputtering face. The multiple sputtering tracks allows a relatively small magnetron, for example, having an effective diameter of less than 20% or even less than 10% of the usable diameter of the target 16. Thereby, the instant magnetic field is localized over a smaller area of the target 16, increasing the target power density, the plasma density, and the ionization fraction. A scan is preferably performed for at least one and preferably multiple complete 360° rotations for each track 460, 462, 464 at respective radii. The number of rotations may be optimized for different ones of the tracks to achieve more uniform wafer deposition, for example, to compensate for differing dwell times as a function of radius because of the variation of local magnetron speed at different radii. The track spacing may be also be optimized and need not be uniform across the target. It may also be desired to vary the target power or wafer bias power for different radii of sputtering. Additionally, the sputter reactor may be operated in cleaning mode to scan over one or more circular tracks 466 under conditions favor target cleaning over wafer deposition to, for example, clean the center of the target 16 of redeposited material. It is understood that in commercial practice in view of the fact that the magnetron 50 is rotating at about 95 rpm, it is likely that the sputtering will continue as the magnetron 50 is moved from one track to another while it continues to rotate about the center 60, resulting in a curved connecting track. However, once the new track has been established, it is typical to perform one or more complete revolutions.

Figure 23:
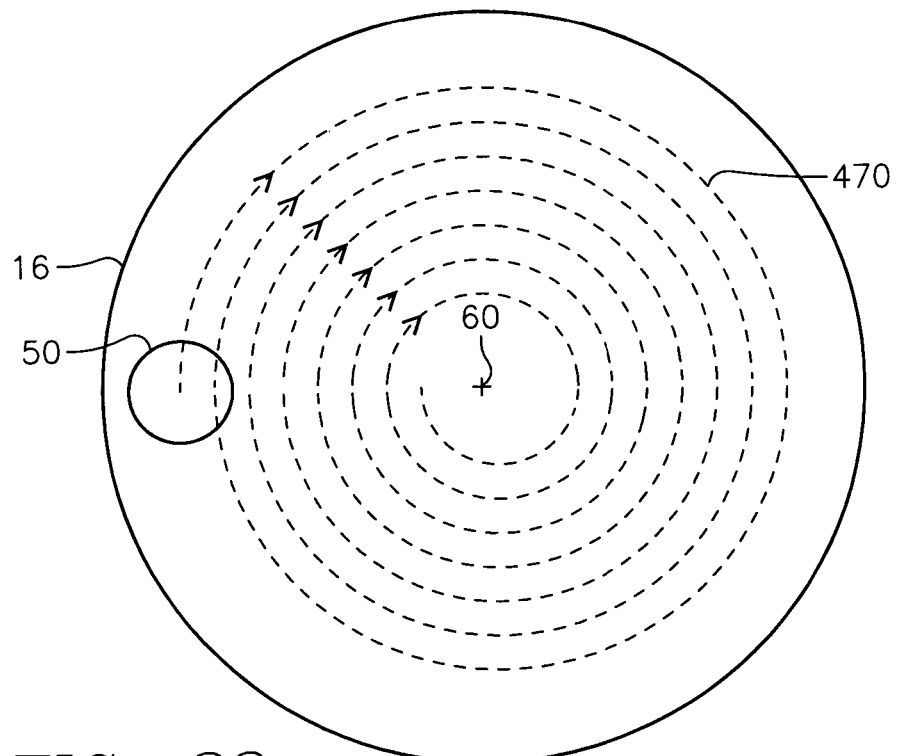
FIG. 23 is a schematic plan view a spiral magnetron track allowed by the continuously variable actuator drive of the invention.

The tracks illustrated in FIG. 22 assume that the radial position is not changed during a significant portion of the sputtering at a particular radius. That is, the radial movement of the magnetron is performed in discrete steps separated by at least one magnetron rotation. However, it is possible to continuously radially move the magnetron during its rotation to achieve a spiral track 470 illustrated in the plan view of FIG. 23 having wraps which may be evenly spaced or be differentially spaced. The spiral scan can be performed from the outside inwardly, as illustrated, or from the inside outwardly. Again, sputtering conditions may change along the spiral track 420. It is of course appreciated that a mechanically based actuator, particularly one based on a stepper motor does not produce infinitely continuous radial movement but instead typically produces a series of small discrete steps. A spiral track or other continuous track is closely approximated when there are at least two and preferably at least four radial steps for each complete rotation of the magnetron about the target center.

The quick transition speeds of the uni-directional dual-position or continuously variable multi-position magnetron allow it to be used to clean the target for each wafer without seriously impacting throughput. The cleaning may be performed after the processed production wafer has been removed from the reactor and before a new production wafer is inserted into the reactor. On the other hand, cleaning for each wafer requires only a very short sputter period of sputtering material already in the barrier As a result, the cleaning may be performed in situ while the production wafer is in the reactor. In particular, or a bilayer barrier layer, for example, of TaN/Ta, the sputtering may begin with a short, for example 2 or 3 seconds, period of reactive sputtering of TaN in the presence of nitrogen with the magnetron positioned near the target center because of low rotation rate. The short initial inner sputtering should be sufficient to prevent TaN from accumulating on the target center after many process cycles. Thereafter, the magnetron may be moved nearer to the target periphery while the sputtering of TaN continues. The final Ta sputtering may be performed with the magnetron positioned nearer to the target periphery. Sputter depositing with the magnetron positioned near the center may be used to improve deposition uniformity. Although the center cleaning may be performed for every wafer cycle, it is not necessary. Instead, center cleaning after multiple wafer cycles, for example, every 50 or even 500 wafers, may be sufficient to clean the redeposited material from the target center. Further, in some situations such as those described by Rosenstein, cleaning from the target periphery may be needed.

Although the invention has been described for varying the magnetron position between the steps of sputter deposition and target cleaning, the magnetron can be moved for other purposes, for example, igniting the plasma or changing to sputter etching of the wafer. Gung et al. describe a sputter reactor configurable for different modes of operation including differentially controllable quadruple electromagnet array in provisional application 60/574,905, filed May 26, 2004 and in U.S. patent application Ser. No. 10/950,349, filed Sep. 23, 2004 and entitled VARIABLE QUADRUPLE ELECTROMAGNET ARRAY IN PLASMA PROCESSING, incorporated herein by reference in its entirety. Gung et al. describe a tantalum sputtering process to be performed in such a chamber in U.S. patent application Ser. No. 11/119,350, filed Apr. 29, 2005. The invention is also advantageously practiced with a mechanism for varying the spacing between the target and the magnetron, as disclosed by Subramani et al. in provisional application 60/555,992, filed Mar. 24, 2004. Hong et al. disclose a more general mechanism and process in U.S. patent application Ser. No. 10/942,273 filed Sep. 16, 2005 and entitled MECHANISM FOR VARYING THE SPACING BETWEEN SPUTTER MAGNETRON AND TARGET, incorporated herein by reference in its entirety.

Although the invention has been described in terms of sputtering a refractory barrier metal, particularly tantalum, and its nitride, the invention may be applied to other barrier metals, such as titanium and tungsten, and also to metals used in siliciding, such as cobalt, nickel, and molybdenum. The invention may also be applied to metallization metals and their seed layers, particularly aluminum, which is subject to flaking redeposition, and also to copper, for which different sputtering characteristics may be desired in a multi-step process. The flexibility afforded by a two-position magnetron may be used in sputtering other types of materials, including RF sputtering of metals or insulators.

The invention thus provides additional control of sputtering and target cleaning and of controllably varying sputtering characteristics with fairly minor changes in the magnetron scanning mechanism that can be easily incorporated into existing reactor designs.

The invention claimed is:

1. A method of sputtering in a plasma sputter reactor arranged about a central axis and having a target in opposition to a pedestal supporting a substrate to be sputter coated with a material of said target, including the steps of:
    selecting different first and second radii from within a radial range based upon a recipe for processing the substrate;
    a first step of rotating a magnetron about the central axis at the first radius; and
    a second step of rotating said magnetron at a second radius less than said first radius about said central axis;
    wherein the magnetron is moved by a magnetron mechanism, comprising:
        a rotary shaft;
        a fixed arm fixed to the rotary shaft;
        a pivoting arm supported on and pivoting relative to the fixed arm and supporting a magnetron to be facing a sputtering target; and
        a motive source acting exterior to a sputter chamber containing the magnetron and causing the pivoting arm to pivot on the fixed arm.

2. The method of claim 1, wherein the magnetron mechanism further comprises an extensible actuator connected between the fixed arm and the pivoting arm.

3. The method of claim 2, wherein the actuator is a hydraulic cylinder connected by a fluid conduit to the motive source.

4. The method of claim 3, wherein the hydraulic cylinder actuator is a slave cylinder and the motive source is a master cylinder.

5. The method of claim 1, wherein the magnetron mechanism further comprises:
    first and a second coaxial shafts, the fixed arm being fixed to the first coaxial shaft;
    a first arm fixed to the second coaxial shaft; and
    a second arm pivoting on and supported by the first arm and pivotally connected to the pivoting arm, a frog leg structure thereby being formed.

6. The method of claim 5, wherein the motive source is a first motor and wherein the magnetron mechanism further comprises:
    a second motor; and
    at least one differential gear assembly linking the first and second motors to at least one of the first ands second coaxial shafts.

7. The method of claim 1, wherein the magnetron mechanism further comprises:
    a cable having a first end fixed to the pivoting arm, wound around a pulley mounted on fixed arm, leading through a passageway in the rotary shaft, and having a second end connected to the motive source.

8. The method of claim 1, wherein the second end is fixed to an axially deformable coupling fixed to the rotary shaft.

* * * * *